United States Patent
Yoshimoto

(10) Patent No.: US 6,489,222 B2
(45) Date of Patent: Dec. 3, 2002

(54) METHOD OF MANUFACTURING A SEMICONDUCTOR DEVICE

(75) Inventor: Satoshi Yoshimoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/866,743

(22) Filed: May 30, 2001

(65) Prior Publication Data

US 2002/0009818 A1 Jan. 24, 2002

(30) Foreign Application Priority Data

Jun. 2, 2000 (JP) ........................... 2000-165708

(51) Int. Cl.⁷ .................. H01L 21/46; H01L 21/20; H01L 21/36
(52) U.S. Cl. .................. 438/486; 438/487; 148/DIG. 93
(58) Field of Search .................. 438/486, 487; 148/DIG. 93

(56) References Cited

U.S. PATENT DOCUMENTS

| | | | |
|---|---|---|---|
| 5,643,826 A | | 7/1997 | Ohtani et al. |
| 5,712,191 A | * | 1/1998 | Nakajima et al. ............. 117/8 |
| 5,904,550 A | * | 5/1999 | Yamaguchi .......... 148/DIG. 93 |
| 6,190,949 B1 | * | 2/2001 | Noguchi et al. ............ 438/149 |
| 6,204,156 B1 | * | 3/2001 | Ping ............................. 117/10 |
| 6,326,286 B1 | * | 12/2001 | Park et al. ................... 438/478 |
| 6,337,109 B1 | * | 1/2002 | Yamazaki et al. .......... 427/124 |

FOREIGN PATENT DOCUMENTS

| | | | |
|---|---|---|---|
| JP | 07-183540 | 7/1995 | |
| JP | 08008179 A | * 1/1996 | .......... H01L/21/20 |

OTHER PUBLICATIONS

R. Ishihara and A. Burtsev "Location–Controlled Adjacent Grains Following Excimer–Laser Melting of Si Thin–Films", AM–LCD '98, pp. 153–156, Jul. 9–10, 1998.
Satoshi Yoshimoto, et al., "Excimer–Laser–Produced and Two–Dimensionally Position–Controlled Giant Si Grains on Organic SOG Underlayer", AM–LCD '00, pp. 285–286, Jul. 12–14, 2000.
S. Yoshimoto, et al., "Preparation of Two–Dimensionally Position–Controlled Giant Single–Crystal of Si Thin–Film", 47th Applied Physics Society Symposium, 29p–YK–8, Mar. 2000.

* cited by examiner

Primary Examiner—Eddie Lee
Assistant Examiner—Paul E Brock, II
(74) Attorney, Agent, or Firm—Fish & Richardson P.C.

(57) ABSTRACT

A first insulating layer is embedded within a semiconductor film formed on a base insulating film, a second insulating layer is formed on a portion of the semiconductor film, and a laser beam is irradiated from the top side (or from both the top side and the bottom side) of the substrate. A thermal gradient develops in the semiconductor film due to the thermal insulating effect of the base insulating film, due to the thermal insulating effect of the first insulating layer, and due to the antireflection effect and thermal insulating effect of the second insulating layer. The location and direction of lateral growth of crystal nuclei are controlled by utilizing these effects, and large size crystal grains can be obtained.

36 Claims, 17 Drawing Sheets

Fig. 7A
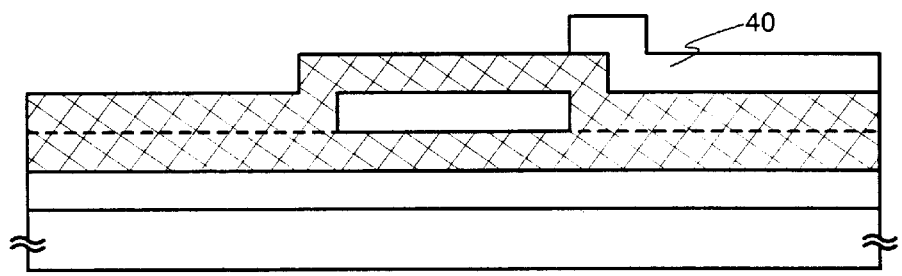
Fig. 7B
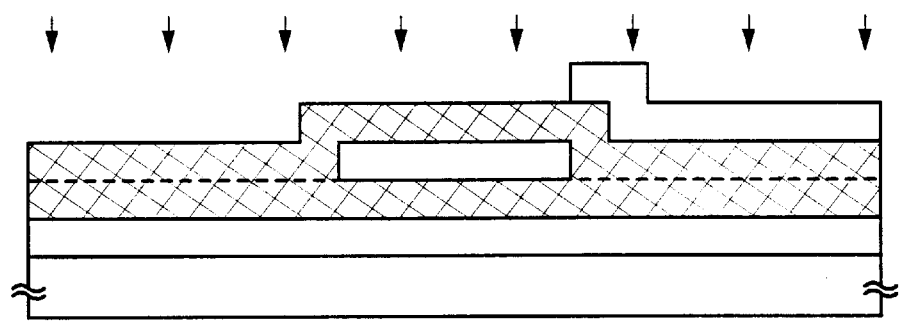
Fig. 7C
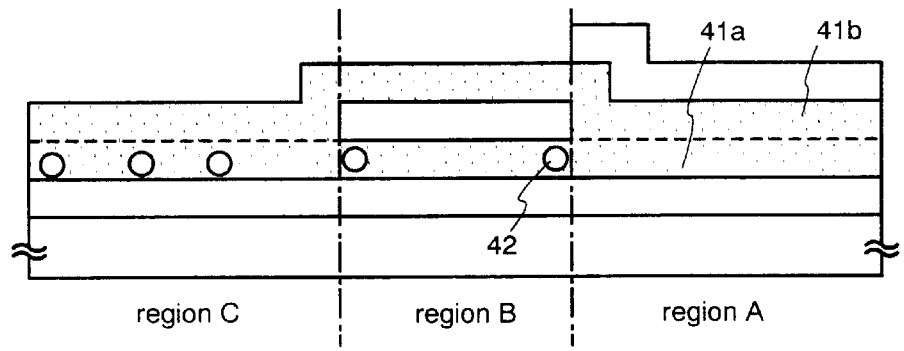
Fig. 7D cross sectional view
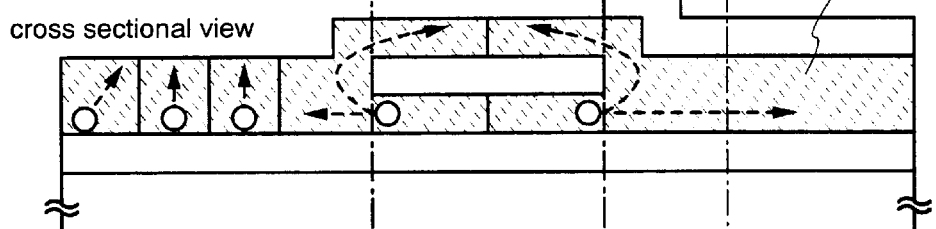
top view
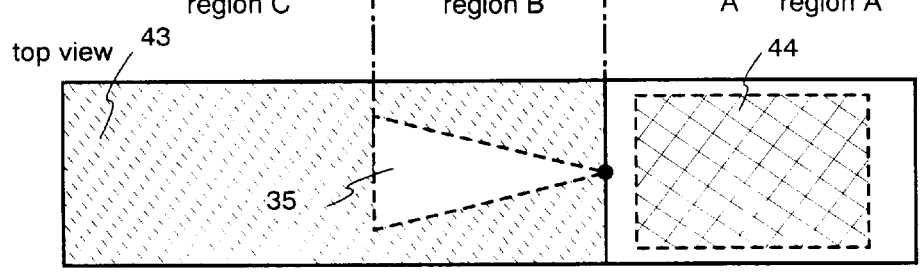

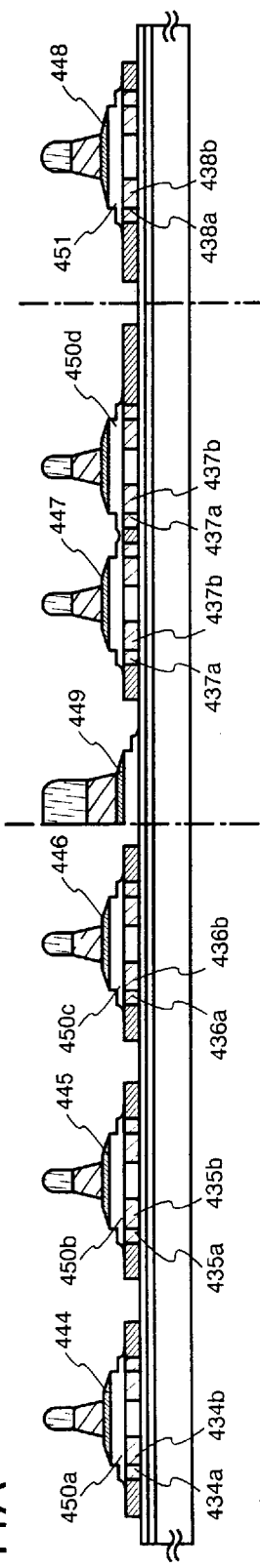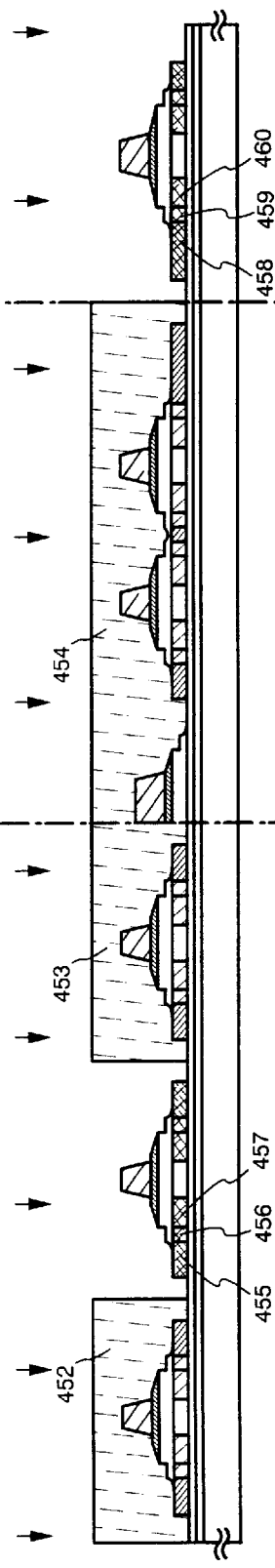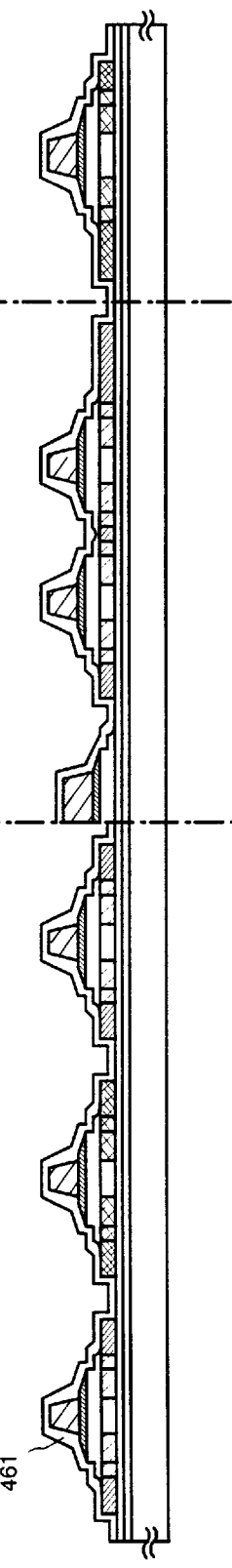

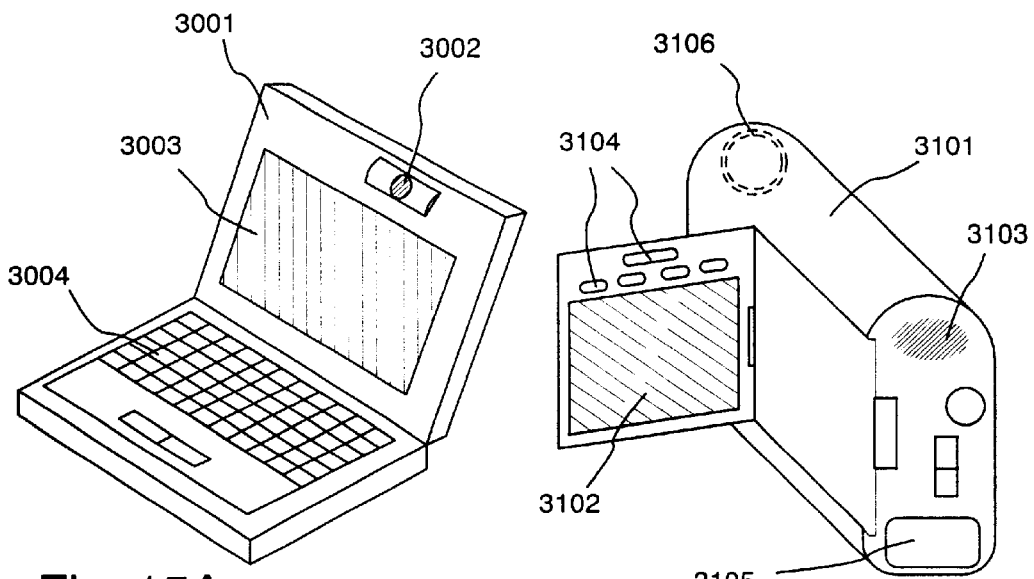
Fig. 15A
Fig. 15B
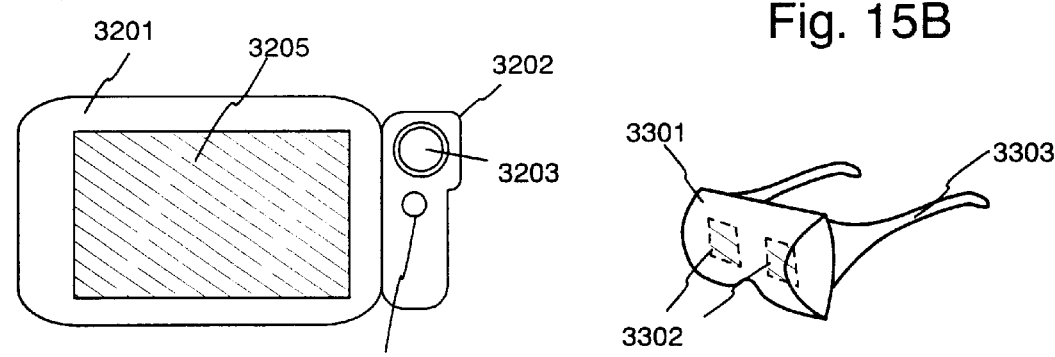
Fig. 15C
Fig. 15D
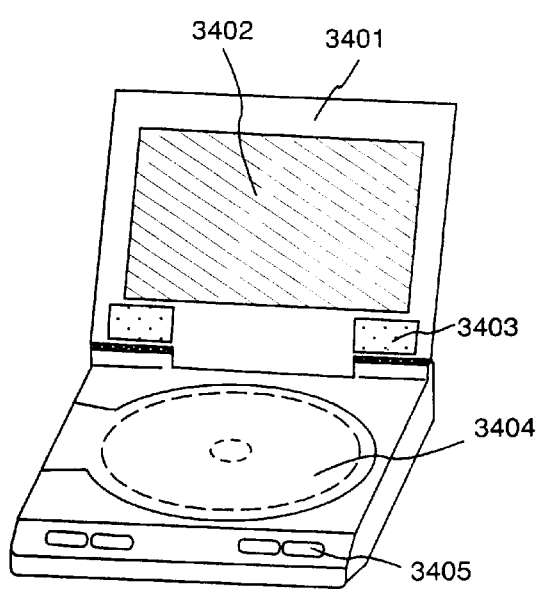
Fig. 15E
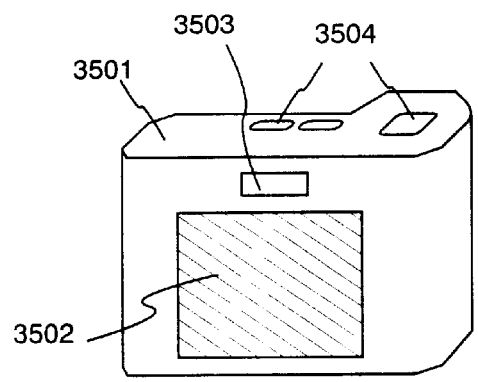
Fig. 15F

METHOD OF MANUFACTURING A SEMICONDUCTOR DEVICE

BACKGROUND OF THE INVENTION

1. Field of the Invention

The present invention relates to a method of manufacturing a semiconductor device having a circuit constituted of a thin film transistor (hereafter referred to as a TFT). For example, the present invention relates to an electro-optical device, typically an EL display device or a light-emitting device, and to the structure of electronic equipment in which an electro-optical device is included as a part. Further, the present invention relates to a method of manufacturing the above device. Note that, throughout this specification, the category "semiconductor device" indicates general devices which can function by utilizing semiconductor characteristics, and the above electro-optical devices and electronic equipment are within the semiconductor device category.

2. Description of the Related Art

Research into techniques of increasing crystallinity when implementing laser annealing on an amorphous semiconductor film formed on an insulating substrate such as glass, thereby crystallizing the amorphous semiconductor film, has been widely performed in recent years. Silicon is often used as the amorphous semiconductor film.

Glass substrates are blessed with low cost and good workability compared with the synthetic quartz substrates often used conventionally, and possess an advantage of being easily manufactured into a large surface area substrate. This is the reason that the above research is being carried out. Further, the preferable use of a laser for crystallization is due to the melting point of glass substrates. Lasers are capable of imparting high energy only to the amorphous semiconductor films, without raising the temperature of the substrate very much.

Crystalline semiconductor films are formed from many crystal grains, and therefore they are also referred to as polycrystalline semiconductor films. A crystalline semiconductor film formed by implementing laser annealing has a high mobility, and TFTs are formed using the crystalline semiconductor film, for example TFTs for a pixel portion and a driver circuit portion formed on one glass substrate, are enthusiastically utilized in such devices as a monolithic type liquid crystal electro-optical device.

Further, a high output pulse laser beam such as an excimer laser beam widely used due to the fact that a method for performing laser annealing, in which the laser beam is formed into a square spot shape of several centimeters, or into a linear shape having a length of 10 cm or more by an optical system, on a surface to be irradiated, and then scanned (or the laser beam irradiation apparatus can be moved relative to the surface to be irradiated), has high productivity and superior workability.

In particular, the productivity is high if a linear shape beam is used, because differing from a case of using a spot shape laser beam in which it is necessary to scan forward and backward, and left and right, laser irradiation can be performed over the entire surface to be irradiated by scanning only in a direction perpendicular to the longitudinal direction of the linear shape beam. Scanning in a direction perpendicular to the longitudinal direction is performed because that is the scanning direction having the maximum efficiency. The use of a linear shape beam, formed by an appropriate optical system from a pulse emission excimer laser beam, in the laser annealing method at present due to superior productivity is becoming the main production technique for liquid crystal display devices which use TFTs. This technique makes possible a monolithic type liquid crystal display device in which TFTs forming a pixel portion (pixel TFTs), and driver circuit TFTs formed in the periphery of the pixel portion, are all formed on one glass substrate.

However, a crystalline semiconductor film manufactured by the laser annealing method is formed by a plurality of crystal grains, and the position and size of the crystal grains is random. The TFTs formed on the glass substrate are separated by element, and therefore formed by separating the crystalline semiconductor film into island shape patterns. The size and the position of the grains cannot be set in this case. Compared to within a crystal grain, there are an almost limitless number of re-crystallization centers and capture centers in the boundaries of the crystal grains (grain boundaries) which are the cause of amorphous structure and crystal defects. If a carrier is trapped in a capture center, then the potential of the grain boundary increases and this becomes a barrier with respect to the carrier, and it is known that the electric current transporting characteristics therefore drop. The crystallinity of the semiconductor film of a channel forming region has a great influence on the TFT properties, but it is nearly impossible to form the channel forming region by a single crystal semiconductor film, eliminating the effect of the grain boundaries.

In order to solve this type of problem, position is controlled for laser annealing, and various tests have been performed for forming large size crystal grains. A solidification process of the semiconductor film after the laser beam is irradiated to the semiconductor film is explained here first.

A certain amount of time is necessary until crystal nuclei develop within a semiconductor film which has been completely melted by laser beam irradiation, a large number of crystal nuclei are generated uniformly (or non-uniformly) in the completely melted region, and the solidification process of the completely melted semiconductor film is completed by crystal growth. The position and the size of the crystal grains obtained in this case becomes random.

Further, for cases in which the semiconductor film is not completely melted by the laser beam irradiation and solid semiconductor regions remain partially, crystal growth begins from the solid semiconductor regions immediately after laser beam irradiation. As stated above, a certain amount of time is necessary until crystal nuclei develop in the completely melted region. Thus, during the period until crystal nuclei develop in the completely melted region, the solid-liquid interface (indicating the interface between the solid semiconductor region and the completely melted region), which is the crystal growth leading edge, moves in a direction parallel to the film surface of the semiconductor film (hereafter referred to as a lateral direction), and crystal grains grow to a length several tens of times longer than the film thickness. A very large number of crystal nuclei develop uniformly (or non-uniformly) in the completely melted region with this type of growth, which is completed by crystal growth. This type of phenomenon is hereafter referred to as "super lateral growth."

A laser beam energy region for also achieving super lateral growth in amorphous semiconductor films and in polycrystalline semiconductor films exists. However, this energy region is extremely narrow, and positions at which large size crystal grains are obtained cannot be controlled. In addition, microcrystalline regions, in which a very large number of crystal nuclei develop, and amorphous regions exist in regions outside the large size crystal grains.

As explained above, the position of grain growth and the growth direction can be controlled provided that the lateral direction temperature gradient is controlled by a laser beam energy region in which the semiconductor film is completely melted (making heat flow arise in a lateral direction). Several tests have been performed in order to realize this method.

For example, Ishihara, R., and Burtsev, A., (AM-LCD '98, pp. 153–156, 1998) reported on a laser annealing method in which they formed a high melting point metallic film between a substrate and a base silicon oxide film, and formed an amorphous silicon film above the high melting point metallic film, and then irradiated an excimer laser beam from both the top surface side of the substrate (defined in this specification as the face upon which the film is formed) and from the bottom surface side of the substrate (defined in this specification as the face on the opposite side as the face upon which the film is formed). The laser beam which is irradiated from the top surface of the substrate is absorbed by the silicon film and its energy is converted into heat. On the other hand, the laser beam which is irradiated from the bottom surface is absorbed by the high melting point metallic film and its energy is converted to heat; the high melting point metallic film is heated to a high temperature. The silicon oxide film between the heated high melting point metallic film and the silicon film works as a heat accumulation layer, and therefore the cooling speed of the melted silicon film can be slowed. It is reported that crystal grains having a maximum diameter of 6.4 μm can be in arbitrary locations by forming the high melting point metallic film in the arbitrary locations.

James S. Im, et al., of Columbia University showed a sequential lateral solidification method (hereafter referred to as SLS method) in which super lateral growth can be achieved in arbitrary locations. The SLS method is one in which crystallization is performed by moving a slit shaped mask over a distance on the order of which super lateral growth takes place (approximately 0.75 μm) every shot.

In addition, Masakiyo Matsumura, et al., of the Tokyo Institute of Technology reported, at the 47th Applied Physics Society Symposium, a method of forming large size crystal grains which are controlled by position. With this method, an insulating layer having a quadrilateral top surface shape and having at least one vertex with an angle of 60° is embedded within an amorphous silicon film, as shown in FIG. 5C. In addition, an insulating film is formed on the amorphous silicon film. A phase shift mask (see FIG. 5A) is used during laser beam irradiation, and the laser beam is made to possess an energy gradient (see FIG. 5B). Provided that a temperature gradient is formed within the amorphous silicon film, crystal nuclei develop within the amorphous silicon film under the insulating layer, and therefore large size crystal grains are formed at a controlled position.

It is structurally possible to manufacture a top gate TFT with a semiconductor film, formed in accordance with the method of Ishihara, et al., as an active layer. However, a parasitic capacitance develops in accordance with the silicon oxide film formed between the semiconductor film and the high melting point metallic film, and energy consumption is therefore increased, and it becomes difficult to achieve high speed TFT operation. On the other hand, it is thought that this method can be effectively applied to a bottom gate or inverse stagger TFT by using the high melting point metallic film as a gate electrode. However, with a structure in which a silicon oxide film is formed on a substrate, then a high melting point metallic film is formed on the silicon oxide film, and an amorphous silicon film is formed on the high melting point metallic film. Even if the thickness of the amorphous silicon film is not considered, the film thickness of the high melting point metallic film and that of the silicon oxide film is such that the film thickness suitable for the crystallization process is not necessarily in agreement with that suitable for good TFT element properties. Optimal design in the crystallization process and optimal design of the element structure therefore cannot both be satisfied at the same time.

Further, if a non light transmitting high melting point metallic film is formed over the entire surface of the glass substrate, then it becomes impossible to manufacture a transmission type liquid crystal display device. The internal stress of a chrome (Cr) film or titanium (Ti) film used as the high melting point metallic material is high, and therefore there is a high likelihood that problems will develop with the adherence of these films to a glass substrate. In addition, the internal stress influence also affects the semiconductor film formed above this layer, and there is a high likelihood of a force acting to distort the formed crystalline semiconductor film.

On the other hand, in order to control the threshold voltage (hereafter denoted by Vth), a very important parameter in TFTs, to be within a predetermined range, it is necessary to control the electric charge of the channel forming region, and in addition, to consider how to reduce the charge defect density of a base film formed by an insulating film in contact with the active layer or a gate insulating film, and how to balance the internal stress. A material containing silicon as a structural element, such as a silicon oxide film and a silicon oxynitride film, is appropriate for these demands. There is a worry that formation of the high temperature metallic film between the substrate and the base film will upset that balance.

Further, precise control on a micron order is required for a technique of determining the relative position between the mask and the substrate with the SLS method, and this will become a complex apparatus compared to a conventional laser irradiation apparatus. In addition, there is a problem with throughput in using this method to manufacture TFTs which will be applied to a liquid crystal display having a large surface area region.

With the method announced by Matsumura, et al., it is necessary to use a phase shift mask in order to make an energy gradient in the laser beam. It is therefore necessary to have precise control on the micron order for a technique of determining a relative position between the phase shift mask and the embedded insulating layer, and this becomes a complex apparatus compared to a conventional laser irradiation apparatus. Further, the top surface shape of the embedded layer is a quadrilateral, and at least one vertex of the quadrilateral is opened to 60°, and therefore a plurality of crystal nuclei develop within the semiconductor film existing below in the vicinity of the vertex when the semiconductor film which has been irradiated by the laser beam is cooled from a melted state. A problem consequently develops in which growing crystal grains collide with each other, reducing the probability of forming large size crystal grains.

SUMMARY OF THE INVENTION

The present invention is one for solving these types of problems, and an object of the present invention is to realize a TFT capable of high speed operation by manufacturing a crystalline semiconductor film in which the position and size of the crystal grains are controlled, and further by using the crystalline semiconductor film as a channel forming region of the TFT. In addition, an object of the present invention is to provide a technique in which this type of TFT can be applied to various types of semiconductor devices such as transmission type liquid crystal display devices and display devices using an electro-luminescence material. The EL (electro-luminescence) materials referred to in this specification include triplet-based light emission devices and/or singlet-based light emission devices, for example.

The reflectivity during irradiation of a laser beam from an insulating film formed on a semiconductor film is explained. Examples are explained here in which an amorphous silicon film and a silicon oxide film are used as the semiconductor film and the insulating film, respectively, and the wavelength of the laser beam is taken as 308 nm and 532 nm, but there are no particular limitation placed upon the semiconductor film, the insulating film, or the wavelength of the laser beam in the present invention.

FIG. 1A shows the changes in reflectivity when an XeCl excimer laser (wavelength 308 nm) is irradiated on a silicon oxide film, with the film thickness of the silicon oxide film as a parameter. It can be seen that the reflectivity of the XeCl excimer laser with respect to the silicon oxide film changes periodically in a range from 26% to 56% in accordance with the film thickness of the silicon oxide film.

Further, when one wants to change the effective irradiation strength of the laser beam with respect to the semiconductor film by forming an insulating film on portions of the semiconductor film, it becomes necessary to also consider the reflectivity of the semiconductor film.

FIG. 1B shows the change in reflectivity when the XeCl excimer laser (wavelength 308 nm) is irradiated on an amorphous silicon film, with the film thickness of the amorphous silicon film as a parameter. With the film thickness of the amorphous silicon film on the order of 5 nm or less, the reflectivity is lower than the minimum reflectivity (26%) obtained when irradiating the XeCl excimer laser on the silicon oxide film and changing the film thickness of the silicon oxide film. Further, the reflectivity when the film thickness of the amorphous silicon film is from 5 to 12 nm is in the same range (26% to 56%) as the reflectivity obtained when irradiating the XeCl excimer laser on the silicon oxide film and changing the film thickness of the silicon oxide film. It is therefore necessary to choose a film thickness of the silicon oxide film in correspondence with the film thickness of the amorphous silicon film for cases in which the effective irradiation strength of the XeCl excimer laser with respect to the amorphous silicon film is changed. When the film thickness of the amorphous silicon film exceeds 12 nm, the reflectivity is on the same order as the maximum reflectivity (56%) obtained when irradiating the XeCl excimer laser on the silicon oxide film while changing the film thickness of the silicon oxide film. The reflectivity also becomes higher than 56%.

Changes in reflectivity when irradiating a laser beam having a 532 nm wavelength are shown next. FIG. 2A shows the changes in reflectivity when the second harmonic (wavelength 532 nm) of a YAG laser is irradiated on a silicon oxide film, with the film thickness of the silicon oxide film taken as a parameter. FIG. 2B shows the changes in reflectivity when the second harmonic of the YAG laser is irradiated on an amorphous silicon film, with the film thickness of the amorphous silicon film taken as a parameter.

As shown in Table 1, the 532 nm wavelength laser beam has a lower attenuation constant than the 308 nm wavelength laser beam with respect to the amorphous silicon film, and therefore the reflectivity when irradiated on the silicon oxide film differs in accordance with the film thickness of the amorphous silicon film existing below the silicon oxide film. The film thickness of the amorphous silicon film is set to 58 nm in FIG. 2A.

TABLE 1

|  | wave length 308 nm | | wave length 532 nm | |
| --- | --- | --- | --- | --- |
|  | attenuation constant k | absorption coefficient α [cm$^{-1}$] | attenuation constant k | absorption coefficient α [cm$^{-1}$] |
| crystalline silicon film | 3.91 | 1.59 × 10$^6$ | 0.12 | 2.74 × 10$^4$ |
| amorphous silicon film | 3.30 | 1.35 × 10$^6$ | 0.39 | 9.31 × 10$^4$ |
| silicon nitride film | 0.01 | 2.45 × 10$^3$ | 0.00 | 8.16 × 10$^2$ |
| Corning #1737 substrate | 0.00 | 8.98 | 0.01 | 4.08 × 10$^3$ |
| synthetic quartz glass | 0.00 | 0.00 | 0.00 | 0.00 |

The reflectivity changes periodically in FIG. 2A, similar to FIG. 1A. The reflectivity shows a tendency to converge while changing periodically as the film thickness of the amorphous silicon film becomes thicker, as shown in FIG. 2B. Further, the reflectivity of the silicon oxide film with respect to the 532 nm wavelength can be seen from FIG. 2A and FIG. 2B to be on the same order as, or less than, the reflectivity of the amorphous silicon film.

In other words, the insulating film has a reflection preventing effect and a heat insulating effect when irradiating the laser beam, provided that the film thickness of an insulating film is given a film thickness having a low laser beam reflectivity when forming the insulating film on a semiconductor film. The semiconductor film can therefore be maintained for a long period in a melted state. Further, if an insulating layer is formed on portions of the semiconductor film, then it is necessary to set the film thickness while considering the reflectivity of the semiconductor film and the reflectivity of the insulating layer when changing the effective irradiation strength of the laser beam with respect to the semiconductor film. In addition, the reflectivity also changes in accordance with the wavelength of the laser beam, and therefore it is necessary to set the film thicknesses corresponding to the laser beam wavelength. It should be noted that the heat insulating effect in this specification means that a melted state of a semiconductor film on which an insulating film is formed is maintained longer time than a semiconductor film on which an insulating film is not formed after laser beam is irradiated to the semiconductor film.

A structure is shown in FIG. 5C in which an insulating layer (embedded insulating layer) having a top surface shape which is quadrilateral, and having at least one vertex with an angle of 60°, exists within a semiconductor film. The 60° angle of the vertex is wide, and therefore a plurality of crystal nuclei develop within the semiconductor film existing below and in the vicinity of the vertex when a laser beam is irradiated. Growing crystal grains consequently collide with each other, and the probability of forming large size crystal grains becomes low. In other words, in order to form large size crystal grains, the density of crystal nuclei developing under a vertex will become lower provided that the angle of at least one vertex is less than 60° when seen from the top surface of the embedded insulating layer. The mutual collision of growing crystal grains can be reduced.

The top surface shape of an insulating layer embedded within a semiconductor film is thus set in the present invention to be a polygonal shape having at least one vertex with an angle of less than 60°. In addition, an insulating film is formed on the semiconductor film, a region overlapping with the embedded insulating layer is etched to form an insulating layer, and the insulating layer is given a reflection prevention effect and a heat insulating effect during irradiation of a laser beam. A crystalline semiconductor film having large size crystal grains in controlled positions is formed. Note that, the irradiation of the laser beam is performed from the top surface side of the substrate, or from both the top surface side and the bottom surface side of the substrate.

BRIEF DESCRIPTION OF THE DRAWINGS

In the accompanying drawings:

FIGS. 7A to 7D are diagrams showing the example of the method disclosed by the present invention of forming a position controlled crystal grain at a large grain size;

FIGS. 11A to 11C are cross sectional diagrams showing the process of manufacturing a pixel TFT and a driver circuit TFT;

FIGS. 15A to 15F are diagrams showing examples of semiconductor devices;

DETAILED DESCRIPTION OF THE PREFERRED EMBODIMENTS

Embodiment Mode

The cross sectional diagrams of FIGS. 3A to 4D are used to explain an embodiment mode of the present invention. Note that a top surface diagram is also given along with a cross sectional diagram for FIGS. 3B and 4D.

Figure 3A:
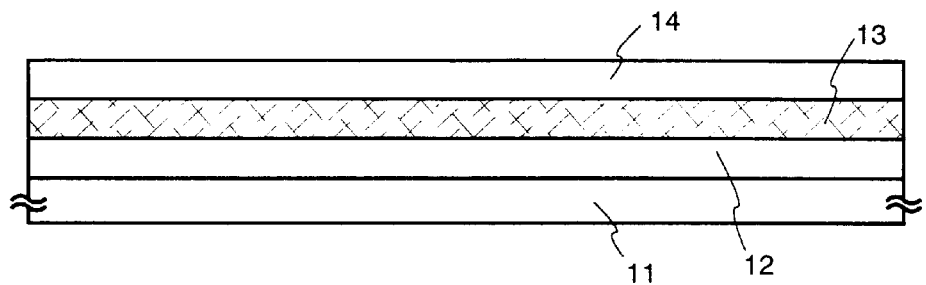
FIGS. 3A to 3D are diagrams showing an example of a method disclosed by the present invention of forming a position controlled crystal grain at a large grain size.
Figure 3B:
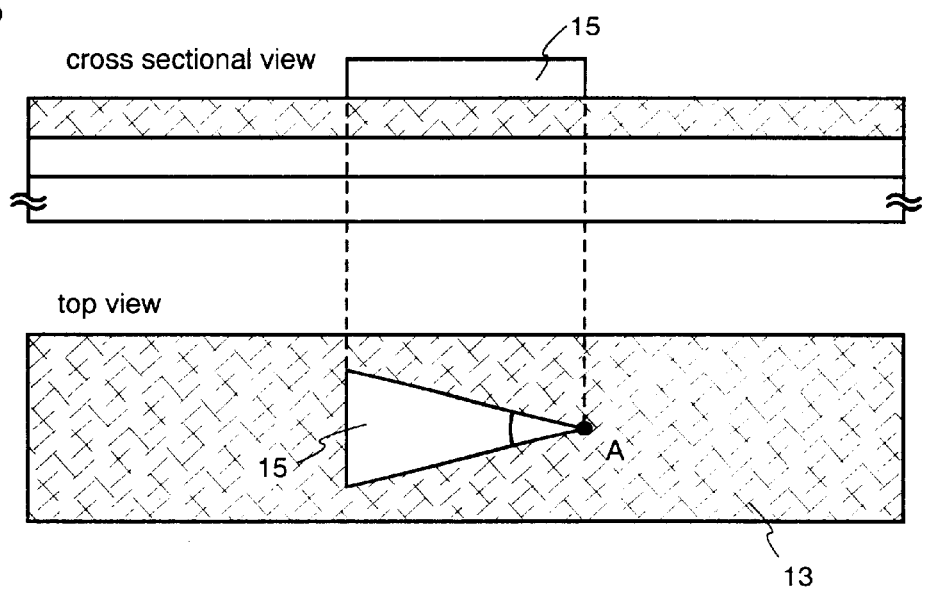
Figure 3C:
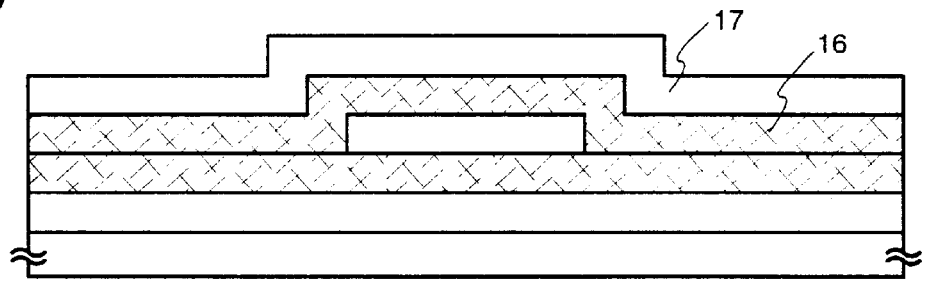

A synthetic quartz glass substrate, non-alkaline glass substrate such as barium borosilicate glass or aluminum borosilicate glass, or a transparent film such as PC (polycarbonate), PAr (polyallylate), PES (polyether sulfone), or PET (polyethylene terepththalate) may be used as a substrate 11 in FIG. 3A. For example, a glass such as Corning Corp. 7059 glass or 1737 glass can be suitably used.

A base insulating film 12 made from a film such as silicon nitride, silicon oxynitride, or silicon oxide is formed on the substrate 11 by a known method (LPCVD, plasma CVD, and the like). Although the base insulating film 12 is formed in mono-layer structure, the base insulating film 12 may be multi-layered structure of more than two layers.

A first semiconductor film 13 shown in FIG. 3A is formed having a thickness from 10 to 200 nm (preferably from 10 to 100 nm) on the base insulating film 12 by a known method such as plasma CVD or sputtering. Note that amorphous semiconductor films, microcrystalline semiconductor films, and polycrystalline semiconductor films may be used as the first semiconductor film 13, and that a chemical compound semiconductor film having an amorphous structure, such as an amorphous silicon germanium film, may also be applied.

A first insulating film 14 is formed from a film such as a silicon nitride film, a silicon oxynitride film, or a silicon oxide film on the first semiconductor film 13 by a known process (such as LPCVD, plasma CVD, or thermal processing). It is preferable that the film thickness of the first insulating film 14 be the same as the film thickness of a second insulating layer 18, formed by a later process, or that the film have a thinner film thickness. This is so that a temperature gradient will easily develop within the semiconductor film when a laser beam is irradiated. A resist mask is formed by a photolithography technique after forming the first insulating film 14, and unnecessary portions are etched, forming an insulating layer 15.

The top surface shape of the insulating layer 15 has a polygonal shape, and the angle of at least one vertex of the polygonal shape is less than 60°. The vertex having the angle less than 60° is hereafter referred to as a vertex A. The angle of the vertex A is made less than 60° in order to reduce the density of nucleation sites within the semiconductor film existing below the insulating film 15 in the vicinity of the vertex A, and in order to prevent mutual collision of growing crystal grains upon the laser beam irradiation.

A dry etching method using a fluoride gas, or a wet etching method using an aqueous fluoride solution may be used for the etching. If the wet etching method is selected, etching may be performed, for example, by a solution containing 7.13% ammonium hydrogen fluoride ($NH_4HF_2$) and 15.4% ammonium fluoride ($NH_4F$) (Stela-chemifa Corp; product name LAL500).

A second semiconductor layer 16 is formed next by a known method such as plasma CVD or sputtering to a thickness of 10 to 200 nm (preferably from 10 to 100 nm). The insulating film 15 which is sandwiched between the first semiconductor film 13 and the second semiconductor film 16 is hereafter referred to as an embedded insulating layer 15.

Figure 1A:
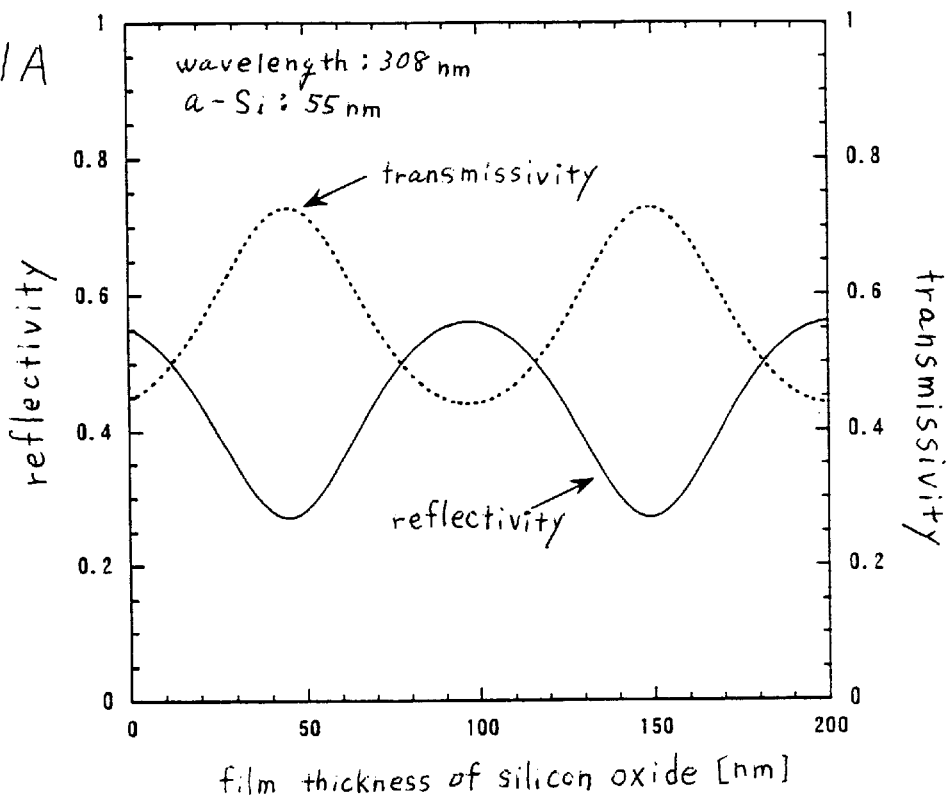
FIGS. 1A and 1B are diagrams showing the reflectivity of a silicon oxide film and an amorphous semiconductor film when irradiating a laser beam having a 308 nm wavelength, with the film thickness of the silicon oxide film taken as a parameter, respectively.
Figure 1B:
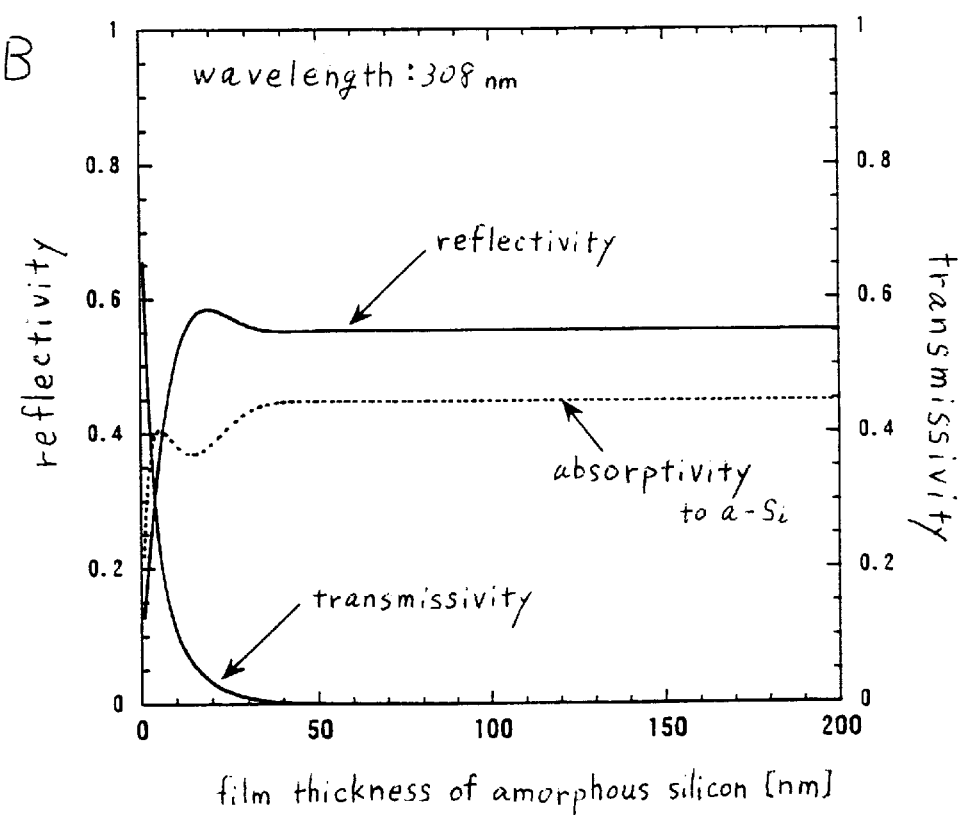
Figure 2A:
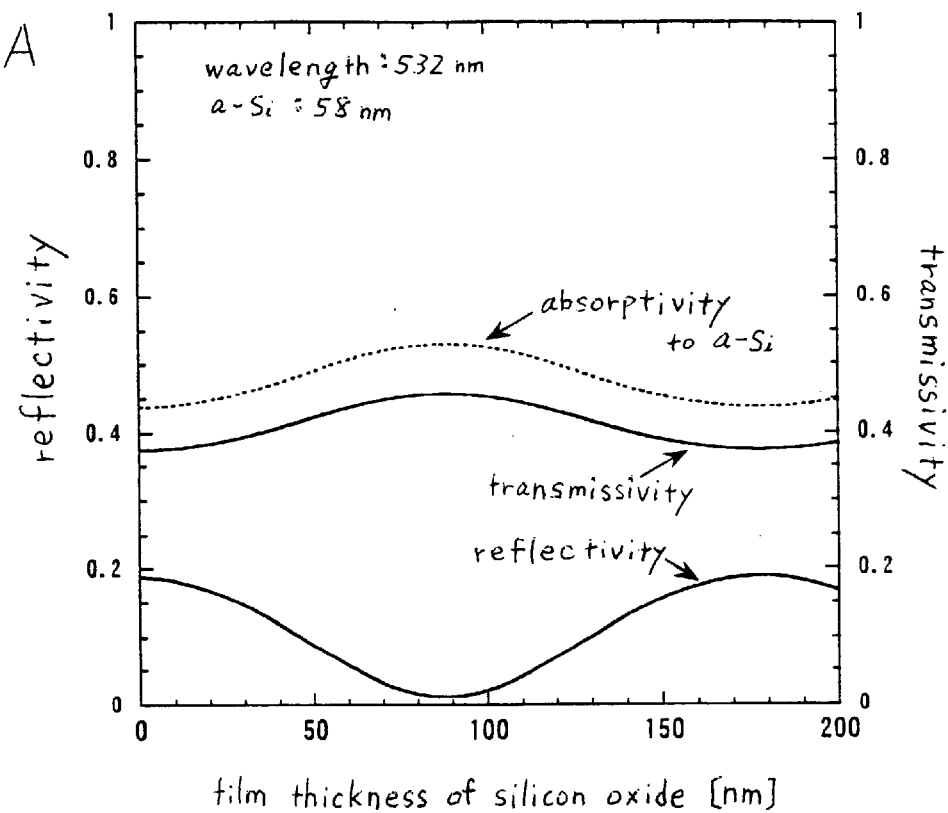
FIGS. 2A and 2B are diagrams showing the reflectivity of a silicon oxide film and an amorphous semiconductor film when irradiating a laser beam having a 532 nm wavelength, with the film thickness of the silicon oxide film taken as a parameter, respectively.
Figure 2B:
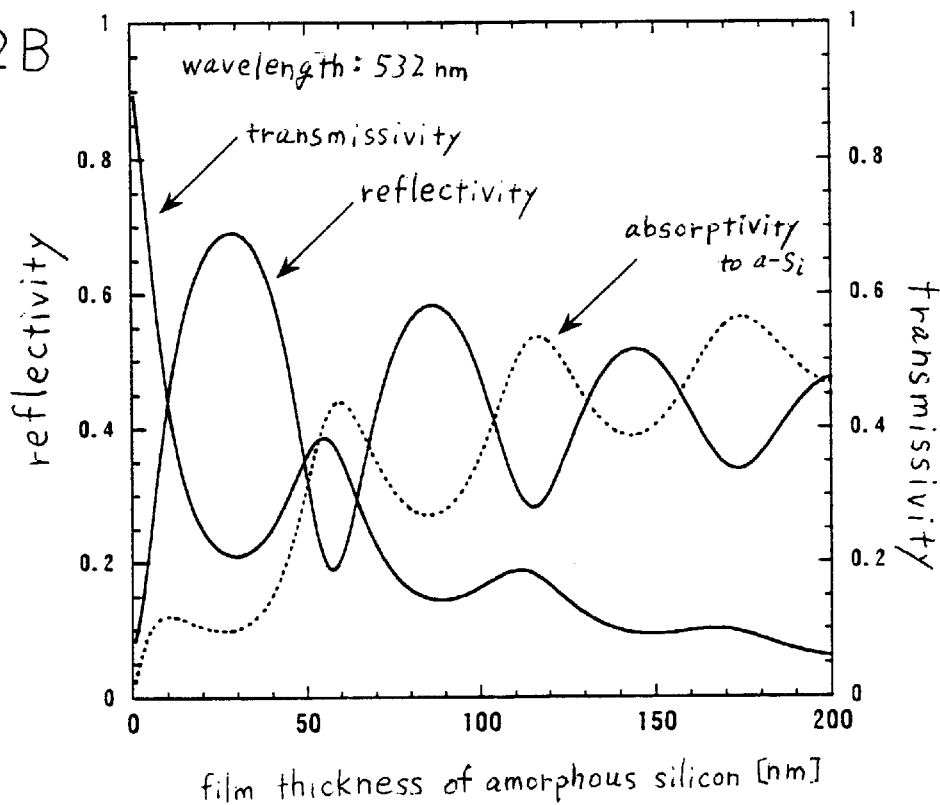

A second insulating film 17 is then formed by a known method (such as LPCVD or plasma CVD) along the second semiconductor film 16 from a film such as a silicon nitride film, a silicon oxynitride film, or a silicon oxide film. It is preferable that the film thickness of the second insulating film 17 be such that its reflectivity is low with respect to the wavelength of the laser beam used when performing laser annealing, as shown in FIG. 1A and in FIG. 2A. The second insulating film 17 thus acts effectively as an anti-reflective film and as a thermally insulating film.

Figure 3D:
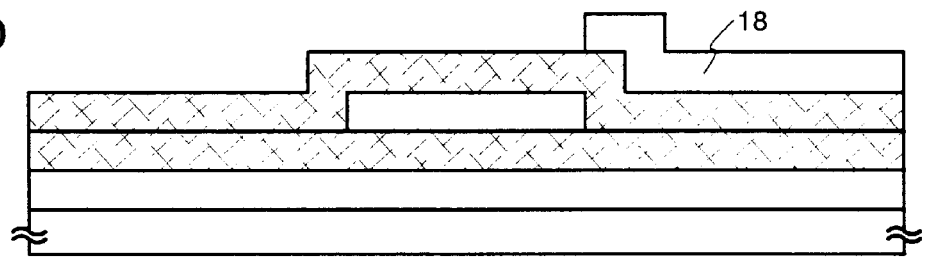

The insulating film 18 is formed by forming a resist mask using a photolithography technique, and etching unnecessary portions, after formation of the second insulating film 17. The insulating layer 18 may be formed by etching only regions which overlap with the insulating layer embedded in the second insulating film 17. In addition, the insulating layer 18 may be formed without overlapping with the embedded insulating film 15, as shown in FIG. 3D, such that the vertex A and the end surface of the insulating layer 18 coincide through the second semiconductor film 16.

Figure 4A:
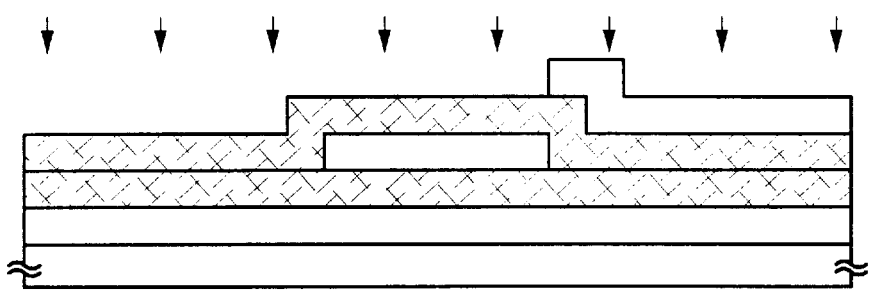
FIGS. 4A to 4D are diagrams showing the example of the method disclosed by the present invention of forming a position controlled crystal grain at a large grain size.
Figure 4B:
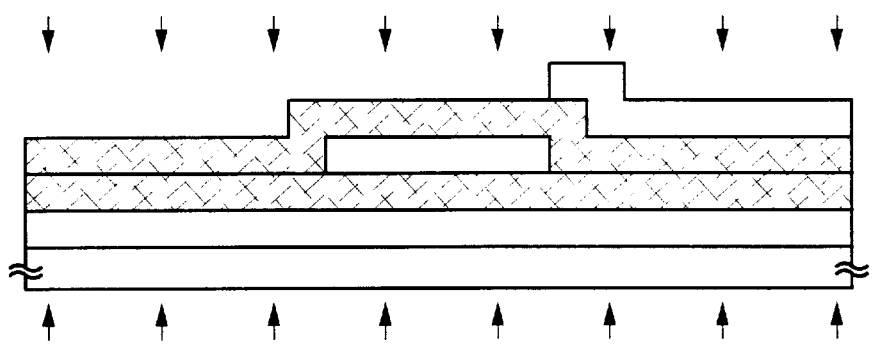

FIGS. 4A and 4B are diagrams for explaining a crystallization process in which a laser beam is irradiated from the top side of the substrate, or from both the top side and the bottom side of the substrate, respectively. Either method may be used in the present invention. It is preferable that hydrogen contained in the semiconductor film be removed first in the laser annealing crystallization method, and the amount of contained hydrogen may be made equal to or less than 5 atom % by exposing the semiconductor film to a 400 to 500° C. hydrogen atmosphere for on the order of one hour. The resistance of the film to the laser is thus raised substantially.

A laser emission apparatus used in the laser annealing method is explained. Excimer lasers are often used because they have high output, and high frequency pulses on the order of 300 Hz can be emitted at present. In addition to the pulse emission excimer laser, lasers such as a continuous emission excimer laser, an Ar laser, a YAG laser, a $YVO_4$ laser, a $YAlO_3$ laser, and a YLF laser can also be used. Further, the laser beam irradiation can be performed in environments such as within the atmosphere, and within a nitrogen atmosphere. The temperature of the substrate may also be heated, on the order of 500° C., when performing laser beam irradiation. The heat flow speed in the semiconductor film can thus be expected to be reduced, and the size of the grains can be enlarged.

Crystallization of the first semiconductor film 13 and the second semiconductor film 17 is performed by irradiation of the laser beam using any of the above laser emission apparatuses, at within any of the atmospheres, and by either the method shown in FIG. 4A or the method shown in FIG. 4B.

Figure 4C:
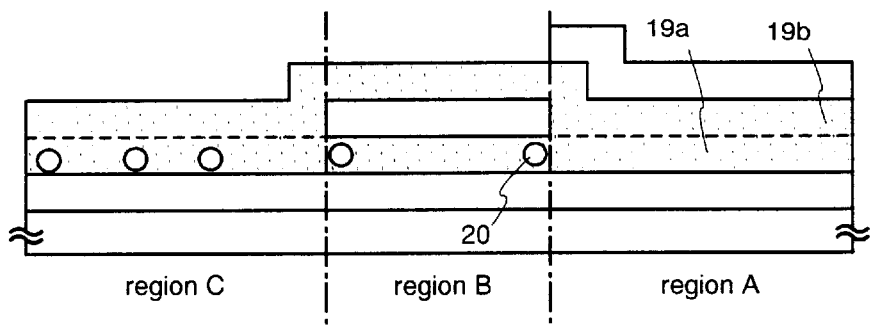
Figure 4D:
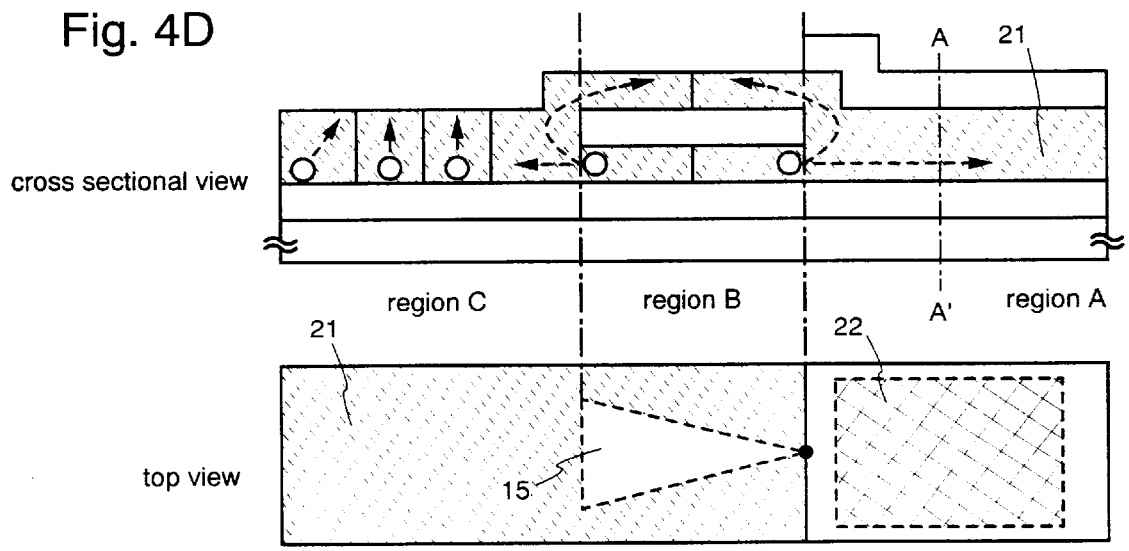
Figure 5A:
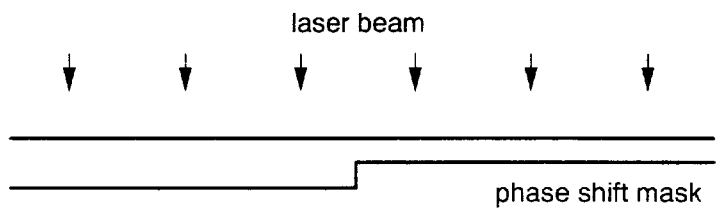
FIG. 5A is a diagram showing an example of a phase shift mask.
Figure 5B:
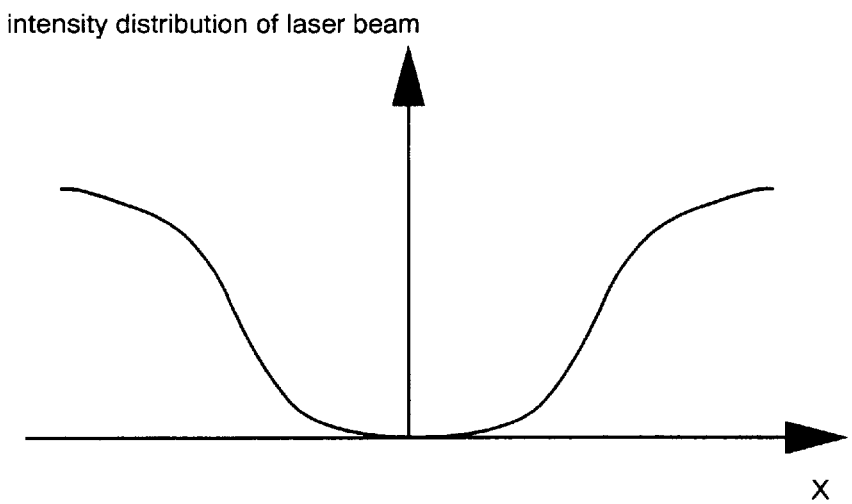
FIG. 5B is a diagram showing the intensity distribution of a laser beam which has passed through a phase shift mask.
Figure 5C:
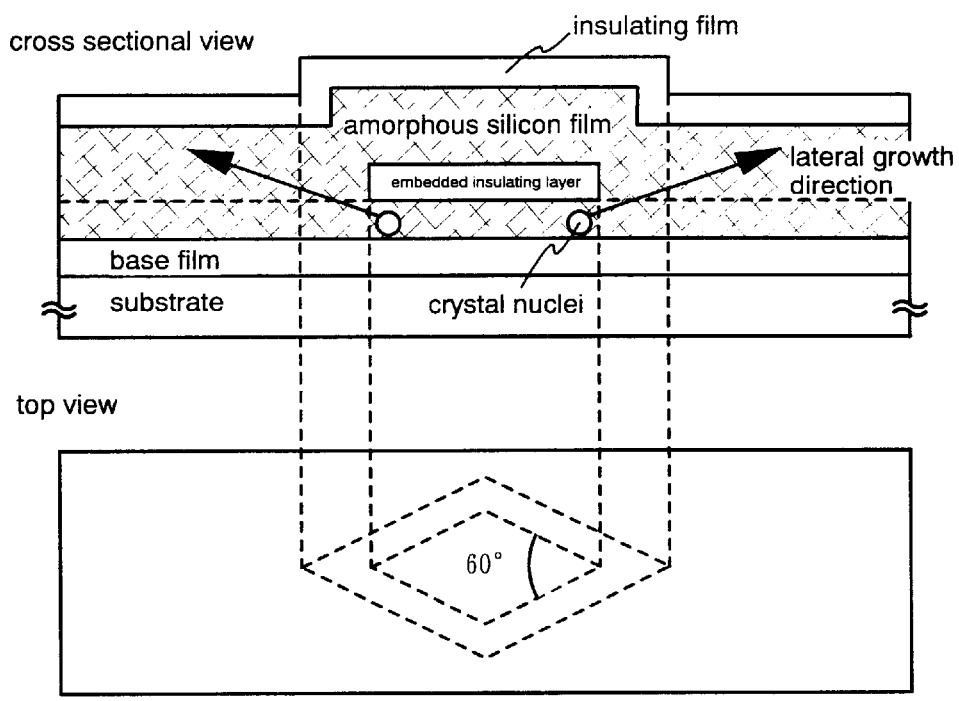
FIG. 5C is a diagram showing an example of a conventional method of forming a position controlled crystal grain at a large grain size.

The region containing the insulating layer 18 is taken as a region A, the region containing the embedded insulating layer 15 is taken as a region B, and the region in which the insulating layers do not exist on the top of the semiconductor films is taken as a region C, as shown in FIG. 4C and in FIG. 4D with both ends of the embedded insulating layer 15 used as a boundary.

The first semiconductor film 13 and the second semiconductor film 16 are placed in a melted state by irradiating the laser beam. The first semiconductor film 13 is referred to as a first semiconductor film 19a after being irradiated by the laser beam, and the second semiconductor film 16 is referred to as a second semiconductor film 19b after being irradiated by the laser beam. The first semiconductor film 19a is irradiated by the laser beam through the second semiconductor film 19b and the embedded insulating layer 15, and therefore it cools quickly in comparison with the second semiconductor film 19b, which is directly irradiated by the laser beam. Crystal nuclei 20 form first within the first semiconductor film 19a. (See FIG. 4C.) The first semiconductor film 19a of the region C, over which the insulating layer 18 does not exist, and the second semiconductor film 19b are cooled, several of the crystal nuclei 20 form, and the region C becomes a microcrystalline region.

Further, the first semiconductor film 19a of the region B is sandwiched by the embedded insulating layer 15 and the base insulating film 12, and its cooling speed becomes slower due to the thermal insulating effect of the embedded insulating layer 15 and of the base insulating film 12. However, the first semiconductor film 19a cools with passing time, and crystal nuclei develop. A distribution of the crystal nuclei 20 corresponding to the shape of the embedded insulating layer 15 develops at this point in the first semiconductor film 19a of the region B. In particular, the angle of the vortex A of the embedded insulating layer 15 is narrow at less than 60°, and therefore the concentration of the crystal nuclei 20 formed becomes low within the first semiconductor film 13 existing below in the vicinity of the vertex A.

On the other hand, the first semiconductor film 19a and the second semiconductor film 19b of the region A are sandwiched by the insulating layer 18 having low laser beam reflectivity and having a heat insulating effect, and by the base insulating film 12 having a heat insulating effect, and therefore the melted state is maintained for a longer time than that of the region C and the region B. A temperature gradient therefore develops between the region A and the region B, and a solid-liquid interface at the crystal growth tip moves from the low temperature region B to the high temperature region A. The crystal nuclei which develop within the first semiconductor film 19a existing under the embedded insulating layer 15 and in the vicinity of the vertex A of the embedded insulating layer 15 thus have crystal growth toward the region A, and large size grains can be obtained in the region A.

Further, if the first semiconductor film 19a in the region B is not completely melted by laser beam irradiation, and solid semiconductor regions partially remain, then immediately after the laser beam irradiation crystal growth proceeds in the direction of the region A from the solid semiconductor region, utilizing the temperature gradient which develops on the inside of the semiconductor layer. Therefore crystal grains having a large grain size can be obtained in the region A.

A crystalline semiconductor film 21 formed by irradiating the laser beam as above can then have any remaining defects neutralized by performing heat treatment in an atmosphere containing from 3 to 100% of hydrogen between 300 and 450° C., or by performing heat treatment between 200 and 450° C. in an atmosphere containing hydrogen generated by a plasma. It should be noted that the crystalline semiconductor film 21 has a larger crystal grains than those of the first semiconductor film 13 and the second semiconductor film 16.

By manufacturing a TFT with a region 22 within the crystalline semiconductor film 21 thus produced, in which large grain size crystal grains are formed as shown in the top surface diagram of FIG. 4D, and by using the region 22 as a channel forming region or an active region, the electrical properties of the TFT can be improved.

Embodiments

[Embodiment 1]

Embodiments of the present invention are explained using the cross sectional diagrams of FIGS. 3A to 4D. Note that a top surface diagram is also given along with a cross sectional diagram for FIGS. 3B and 4D.

A synthetic quartz glass substrate, non-alkaline substrate such as barium borosilicate glass or aluminum borosilicate glass, or a transparent film or PC (polycarbonate), PAr (polyallylate), PES (polyether sulfone), or PET (polyethylene terephthalate) may be used as the substrate 11 in FIG. 3A. For example, a glass such as Corning Corp. 7059 glass or 1737 glass can be suitably used.

The base insulating film 12 made from a film such as silicon nitride, silicon oxynitride, or silicon oxide is formed with a thickness of 10 to 200 nm (preferably from 10 to 100 nm) on the substrate 11 by a known method (LPCVD, plasma CVD, and the like). A silicon oxynitride film having a film thickness of 50 nm (composition ratios: Si=32%; O=27%; N=24%; H=17%) is formed in embodiment 1.

The first semiconductor film 13 shown in FIG. 3A is formed having a thickness from 10 to 200 nm (preferably from 10 to 100 nm) on the base insulating film 12 by a known method such as plasma CVD or sputtering. Note that amorphous semiconductor films, microcrystalline semiconductor films, and polycrystalline semiconductor films may be used as the first semiconductor film 13, and that a chemical compound semiconductor film having an amorphous structure, such as an amorphous silicon germanium film, may also be applied. Plasma CVD is used in embodiment 1, and a 55 nm thick amorphous silicon film is formed.

The first insulating film 14 is formed with a thickness of 10 to 200 nm (preferably from 10 to 100 nm) from a film such as a silicon nitride film, a silicon oxynitride film, or a silicon oxide film on the first semiconductor film 13 by a known process (such as LPCVD or plasma CVD). It is preferable that the film thickness of the first insulating film 14 be the same as the film thickness of the second insulating layer 18, formed by a later process, or that the film have a thinner film thickness. This is so that a temperature gradient will easily develop within the semiconductor film when a laser beam is irradiated. A silicon oxynitride film having a film thickness of 50 nm (composition ratios: Si=32%; O=27%; N=24%; H=17%) is formed in embodiment 1. A resist mask is formed by a photolithography technique after forming the first insulating film 14, and unnecessary portions are etched to form the insulating layer 15.

The top surface shape of the insulating layer 15 is a polygonal shape, and the angle of at least one vertex of the polygonal shape is less than 60°. The vertex having the angle less than 60° is hereafter referred to as a vertex A. The angle of the vertex A is made less than 60° in order to reduce the density of nucleation sites within the semiconductor film existing below the insulating film 15 in the vicinity of the vertex A, and in order to prevent mutual collision of growing crystal grains upon the laser beam irradiation. The top surface shape of the insulating layer 15 is made into a triangular shape in embodiment 1, and the triangular shape is one having a vertex with a 30° angle. (See FIG. 3B.)

A dry etching method using a fluoride gas, or a wet etching method using an aqueous fluoride solution may be used for the etching. If the wet etching method is selected, etching may be performed, for example, by a solution containing 7.13% ammonium hydrogen fluoride (NH$_4$HF$_2$) and 15.4% ammonium fluoride (NH$_4$F) (Stela-chemifa Corp; product name LAL500).

The second semiconductor film 16 is formed next by a known method such as plasma CVD or sputtering to a thickness of 10 to 200 nm (preferably from 10 to 100 nm). A 55 nm thick amorphous silicon film is formed using plasma CVD in embodiment 1. The insulating film 15 which is sandwiched between the first semiconductor film 13 and the second semiconductor film 16 is hereafter referred to as an embedded insulating layer.

The second insulating film 17 is then formed by a known method (such as LPCVD or plasma CVD) along the second semiconductor film 16 from a film such as a silicon nitride film, a silicon oxynitride film, or a silicon oxide film. It is preferable that the film thickness of the second insulating film 17 be such that its reflectivity is low with respect to the wavelength of the laser beam used when performing laser annealing, as shown in FIG. 1A and in FIG. 2A. The second insulating film 17 thus acts effectively as an anti-reflective film and as a thermally insulating film. A silicon oxynitride film having a film thickness of 50 nm (composition ratios: Si=32%; O=27%; N=24%; H=17%) is formed in embodiment 1.

The insulating layer 18 is formed by forming a resist mask using a photolithography technique, and etching unnecessary portions, after formation of the second insulating film 17. The insulating layer 18 may be formed by etching only regions which overlap with the insulating layer embedded in the second insulating film 17. In addition, the insulating layer 18 may be formed without overlapping with the embedded insulating film 15, as shown in FIG. 3D, such that the vertex A and the end surface of the insulating layer 18 coincide through the second semiconductor film 16.

FIGS. 4A and 4B are diagrams for explaining a crystallization process in which a laser beam is irradiated from the top side of the substrate, or from both the top side and the bottom side of the substrate, respectively. Either method may be used in the present invention. It is preferable that hydrogen contained in the semiconductor film be removed first in the laser annealing crystallization method, and the amount of contained hydrogen may be made equal to or less than 5 atom % by exposing the semiconductor film to a 400 to 500° C. hydrogen atmosphere for on the order of one hour. The resistance of the film to the laser is thus raised substantially.

A laser emission apparatus used in the laser annealing method is explained. Excimer lasers are often used because they have high output, and high frequency pulses on the order of 300 Hz can be emitted at present. In addition to the pulse emission excimer laser, lasers such as a continuous emission excimer laser, an Ar laser, a YAG laser, a YVO$_4$laser, a YAlO$_3$laser, and a YLF laser can also be used. Further, the laser beam irradiation can be performed in environments such as within a vacuum, within the ambient atmosphere, and within a nitrogen atmosphere. The substrate may also be heated up to the temperature on the order of 500° C., when performing laser beam irradiation. The heat flow speed in the semiconductor film can thus be expected to be reduced, and the grain size of the grains can be enlarged.

Crystallization of the first semiconductor film 13 and the second semiconductor film 16 is performed by irradiation of a laser beam from the top surface side of the substrate shown in FIG. 4A, using a pulse emission XeCl excimer laser in the atmosphere, and at a substrate temperature of room temperature, in embodiment 1.

The region containing the insulating layer 18 is taken as the region A, the region containing the embedded insulating layer 15 is taken as the region B, and the region in which the insulating layers do not exist on the top of the first semiconductor film 13 and the second semiconductor film 16 is taken as the region C, as shown in FIG. 4C and in FIG. 4D with both ends of the embedded insulating layer 15 used as a boundary.

The first semiconductor film 13 and the second semiconductor film 16 are placed in a melted state by irradiating the laser beam. The first semiconductor film 13 is referred to as a first semiconductor film 19a after being irradiated by the laser beam, and the second semiconductor film 16 is referred to as a second semiconductor film 19b after being irradiated by the laser beam. The first semiconductor film 19a is irradiated by the laser beam through the second semiconductor film 19b or the embedded insulating layer 15, and therefore it cools quickly in comparison with the second semiconductor film 19b, which is directly irradiated by the laser beam. The crystal nuclei 20 form first within the first semiconductor film 19a. (See FIG. 4C.) The first semiconductor film 19a of the region C, over which the insulating layer 18 does not exist, and the second semiconductor film 19b are cooled, many crystal nuclei 20 form, and the region C becomes a microcrystalline region.

Further, the first semiconductor film 19a of the region B is sandwiched by the embedded insulating layer 15 and the base insulating film 12, and its cooling speed becomes slower due to the heat retaining effect of the embedded insulating layer 15 and of the base insulating film 12. However, the first semiconductor film 19a cools with passing time, and crystal nuclei develop. A distribution of the crystal nuclei 20 corresponding to the shape of the embedded insulating layer 15 develops at this point in the first semiconductor film 19a of the region B. In particular, the angle of the vortex A of the embedded insulating layer 15 is narrow at less than 60°, and therefore the concentration of the crystal nuclei 20 formed becomes low within the first semiconductor film 13 existing below in the vicinity of the vertex A.

On the other hand, the first semiconductor film 19a and the second semiconductor film 19b of the region A are sandwiched by the insulating layer 18 having low laser beam reflectivity and having a heat insulating effect, and by the base insulating film 12 having a thermal insulating effect, and therefore the melted state is maintained for a longer time than that of the region C and the region B. A temperature gradient therefore develops between the region A and the region B, and a solid-liquid interface at the crystal growth tip moves from the low temperature region B to the high temperature region A. The crystal nuclei which develop within the first semiconductor film existing under the embedded insulating layer 15 and in the vicinity of the vertex A thus have crystal growth toward the region A, and large size grains can be obtained in the region A.

Further, if the first semiconductor film 19a in the region B is not completely melted by the laser beam irradiation, and solid semiconductor regions partially remain, then immediately after laser beam irradiation crystal growth proceeds in the direction of the region A from the solid semiconductor region, utilizing the temperature gradient which develops on the inside of the semiconductor layer. Therefore crystal grains having a large grain size can be obtained in the region A.

The crystalline semiconductor film 21 formed by irradiating the laser beam as above can then have any remaining defects neutralized by performing heat treatment in an atmosphere containing from 3 to 100% hydrogen between 300 and 450° C., or by performing heat treatment between 200 and 450° C. in an atmosphere containing hydrogen generated by a plasma.

By manufacturing a TFT with the region 22 within the crystalline semiconductor film 21 thus produced, in which large grain size crystal grains are formed as shown in the top surface diagram of FIG. 4D, and by using the region 22 as a channel forming region or an active region, the electrical properties of the TFT can be improved.

[Embodiment 2]

A method of performing laser annealing after partially crystallizing a semiconductor film by heat treatment is explained using the cross sectional diagrams of FIGS. 6A to 7D. Note that a top surface diagram is also given along with a cross sectional diagram for FIGS. 6B and 7D.

Figure 6A:
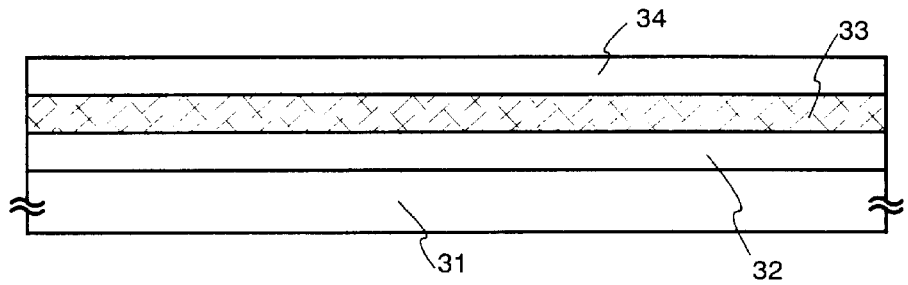
FIGS. 6A to 6D are diagrams showing an example of a method disclosed by the present invention of forming a position controlled crystal grain at a large grain size.
Figure 6B:
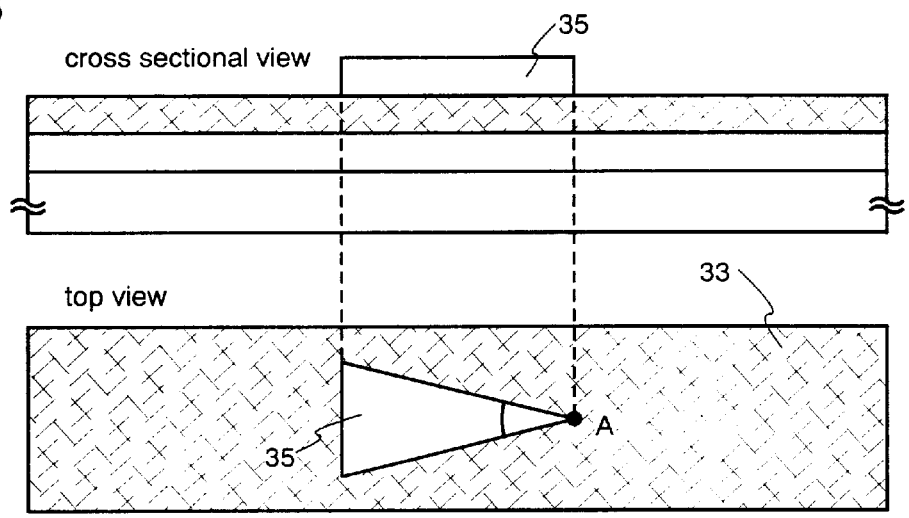
Figure 6C:
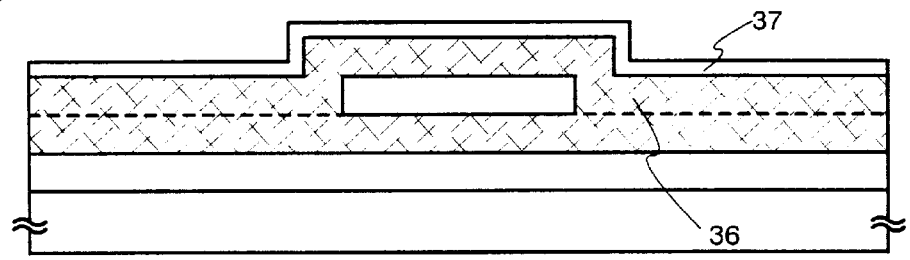
Figure 6D:
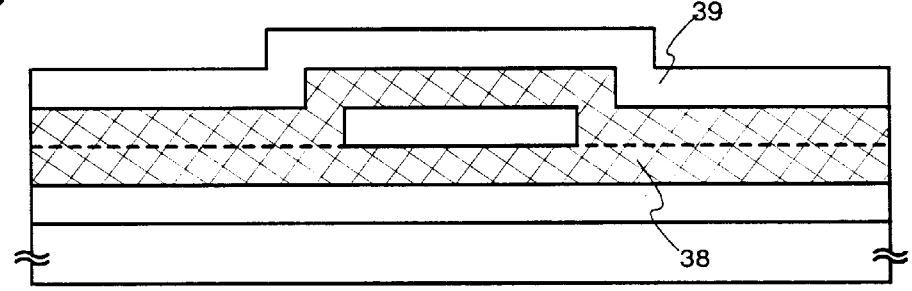

A synthetic quartz glass substrate, non-alkaline glass substrate such as barium borosilicate glass or aluminum borosilicate glass, or a transparent film such as PC (polycarbonate), PAr (polyallylate), PES (polyether sulfone), or PET (polyethylene terephthalate) may be used as a substrate 31 in FIG. 6A. For example, a glass such as Corning Corp. 7059 glass or 1737 glass can be suitably used.

A base insulating film 32 made from a film such as silicon nitride, silicon oxynitride, or silicon oxide is formed with a thickness of 10 to 200 nm (preferably from 10 to 100 nm) on the substrate 31 by a known method (LPCVD, plasma CVD, and the like). A silicon oxynitride film having a film thickness of 50 nm (composition ratios: Si=32%; O=27%; N=24%; H=17%) is formed in embodiment 2.

A first semiconductor film 33 shown in FIG. 6A is formed having a thickness from 10 to 200 nm (preferably from 10 to 100 nm) on the base insulating film 32 by a known method such as plasma CVD or sputtering. Note that amorphous semiconductor films, microcrystalline semiconductor films, or polycrystalline semiconductor films may be used as the first semiconductor film 33, and that a chemical compound semiconductor film having an amorphous structure, such as an amorphous silicon germanium film, may also be applied. Plasma CVD is used in embodiment 2, and a 55 nm thick amorphous silicon film is formed.

A first insulating film 34 is formed with a thickness of 10 to 200 nm (preferably from 10 to 100 nm) from a film such as a silicon nitride film, a silicon oxynitride film, or a silicon oxide film on the first semiconductor film 33 by a known process (such as LPCVD or plasma CVD). It is preferable that the film thickness of the first insulating film 34 be the same as the film thickness of a second insulating film 39, formed by a later process, or that the film have a thinner film thickness. This is so that a temperature gradient will easily develop within the semiconductor film when a laser beam is irradiated. A silicon oxynitride film having a film thickness of 50 nm (composition ratios: Si=32%; O=27%; N=24%; H=17%) is formed in embodiment 2. A resist mask is formed by a photolithography technique after forming the first insulating film 34, and unnecessary portions are etched to form an insulating layer 35.

The top surface shape of the insulating layer 35 is a polygonal shape, and the angle of at least one vertex of the polygonal shape is less than 60°. The vertex having the angle less than 60° is hereafter referred to as the vertex A. The angle of the vertex A is made less than 60° in order to reduce the density of nucleation sites within the semiconductor film existing below the insulating film 35 in the vicinity of the vertex A, and in order to prevent mutual collision of growing crystal grains upon the laser beam irradiation. The top surface shape of the insulating layer 35 is made into a triangular shape in embodiment 2, and the triangular shape is one having a vertex with a 30° angle. (See FIG. 6B.)

A dry etching method using a fluoride gas, or a wet etching method using an aqueous fluoride solution may be used for the etching. If the wet etching method is selected, etching may be performed, for example, by a solution containing 7.13% ammonium hydrogen fluoride ($NH_4HF_2$) and 15.4% ammonium fluoride ($NH_4F$) (Stela-chemifa Corp; product name LAL500).

A second semiconductor film 36 is formed next by a known method such as plasma CVD or sputtering to a thickness of 10 to 200 nm (preferably from 10 to 100 nm). A 55 nm thick amorphous silicon film is formed using plasma CVD in embodiment 2. The insulating film 35 which is sandwiched between the first semiconductor film 33 and the second semiconductor film 36 is hereafter referred to as an embedded insulating layer.

The first semiconductor film and the second semiconductor film are partially crystallized next in accordance with the method described in Japanese Patent Application Laid-open No. 7-183540. A simple explanation of this method is presented here. First, a very small amount of an element such as nickel, palladium, or lead is added into a semiconductor film. Methods such as plasma processing, evaporation, ion implantation, sputtering, and liquid application can be utilized as the addition method. If the semiconductor film is placed, for example, in a 550° C. atmosphere for 4 hours after the addition process, crystalline semiconductor films having good characteristics can be obtained. The optimal heat treatment temperature and heat treatment time is dependent upon the amount of the element introduced and the state of the amorphous semiconductor film. A liquid application method is utilized in embodiment 2 using a nickel acetate solution, and 5 ml of a 10 ppm concentration by weight of the solution is applied onto the entire film surface by spin coating, forming a metal containing layer 37. Heat treatment is then performed on the substrate, first for one hour in a nitrogen atmosphere at a temperature of 500° C., and then successively for four hours in a nitrogen atmosphere at a temperature of 550° C. A partially crystallized first crystalline semiconductor film 38 is obtained.

A second insulating film 39 is then formed by a known method (such as LPCVD or plasma CVD) along the first crystalline semiconductor film 38 from a film such as a silicon nitride film, a silicon oxynitride film, or a silicon oxide film. It is preferable that the film thickness of the second insulating film 39 be such that its reflectivity is low with respect to the wavelength of the laser beam used when performing laser annealing, as shown in FIG. 1A and in FIG. 2A. The second insulating film 39 thus acts effectively as an anti-reflective film and as a thermally insulating film. A silicon oxynitride film having a film thickness of 50 nm (composition ratios: Si=32%; O=27%; N=24%; H=17%) is formed in embodiment 2.

An insulating layer 40 is formed by forming a resist mask using a photolithography technique, and etching unnecessary portions, after formation of the second insulating film 39. The insulating layer 40 may be formed by etching only regions which overlap with the insulating layer embedded in the second insulating film 39. In addition, the insulating layer 40 may be formed in the second insulating film 39 without overlapping with the embedded insulating film 35, as shown in FIG. 7A, such that the vertex A and the end surface of the insulating layer 40 coincide through the first crystalline semiconductor film 38.

It is preferable that hydrogen contained in the semiconductor film be removed first in the laser annealing crystallization method, and the amount of contained hydrogen may be made equal to or less than 5 atom % by exposing the semiconductor film to a 400 to 500° C. hydrogen atmosphere for on the order of one hour. The resistance of the film to the laser is thus raised substantially.

A laser emission apparatus used in the laser annealing method is explained. Excimer lasers are often used because they have high output, and high frequency pulses on the order of 300 Hz can be emitted at present. In addition to the pulse emission excimer laser, lasers such as a continuous emission excimer laser, an Ar laser, a YAG laser, a $YVO_4$ laser, a $YAlO_3$ laser, and a YLF laser can also be used. Further, the laser beam irradiation can be performed in environments such as within the atmosphere, and within a nitrogen atmosphere. The temperature of the substrate may also be heated, on the order of 500° C., when performing laser beam irradiation. The heat flow speed in the semiconductor film can thus be expected to be reduced, and the grain size of the grains can be enlarged.

Crystallization of the first crystalline semiconductor film 38 is performed by irradiation of a laser beam from the top surface side of the substrate shown in FIG. 7B, using a pulse emission XeCl excimer laser in the atmosphere, and at a substrate temperature of room temperature, in embodiment 2. Although not shown in the figures, the laser beam may also be irradiated from both the top surface side and from the bottom surface side.

A region containing the insulating layer 40 is taken as the region A, the region containing the embedded insulating layer 35 is taken as the region B, and the region in which the insulating layers do not exist on the top of the semiconductor films is taken as the region C, as shown in FIG. 7C, with both ends of the embedded insulating layer 35 used as a boundary.

The first semiconductor film 33 and the second semiconductor film 36 are placed in a melted state by irradiating the laser beam. The first semiconductor film 33 is referred to as a first semiconductor film 41a after being irradiated by the laser beam, and the second semiconductor film 36 is referred to as a second semiconductor film 41b after being irradiated by the laser beam. The first semiconductor film 41a is irradiated by the laser beam through the second semiconductor film 41b and the embedded insulating layer 35, and therefore it cools quickly in comparison with the second semiconductor film 41b, which is directly irradiated by the laser beam. Crystal nuclei 42 thus form first within the first semiconductor film 41a. (See FIG. 7C.)

The first semiconductor film 41a of the region C, over which the insulating layer 40 does not exist, and the second semiconductor film 41b are cooled, many crystal nuclei 42 form, and the region C becomes a microcrystalline region.

Further, the first semiconductor film 41a of the region B is sandwiched by the embedded insulating layer 35 and the base insulating film 32, and its cooling speed becomes slower due to the heat insulating effect of the embedded insulating layer 35 and of the base insulating film 32. However, the first semiconductor film 41a cools with passing time, and crystal nuclei develop. A distribution of the crystal nuclei 42 corresponding to the shape of the embedded insulating layer 35 develops at this point in the first semiconductor film 41a. In particular, the angle of the vortex A of the embedded insulating layer 35 is narrow at less than 60°, and therefore the concentration of the crystal nuclei 42 formed becomes low within the first semiconductor film 33 existing below in the vicinity of the vertex A.

On the other hand, the first semiconductor film 41a and the second semiconductor film 41b of the region A are sandwiched by the insulating layer 40 having low laser beam reflectivity and having a heat insulating effect, and by the base insulating film 32 having a heat insulating effect, and therefore the melted state is maintained for a longer time than that of the region C and the region B. A temperature gradient therefore develops between the region A and the region B, and a solid-liquid interface at the crystal growth tip moves from the low temperature region B to the high temperature region A. The crystal nuclei which develop within the first semiconductor film 41a existing under the embedded insulating layer 35 and in the vicinity of the vertex A of the embedded insulating layer 35 thus have crystal growth toward the region A, and large size grains can be obtained in the region A.

Further, if the first semiconductor film 41a in the region B is not completely melted by the laser beam irradiation, and solid semiconductor regions partially remain, then immediately after laser beam irradiation crystal growth proceeds in the direction of the region A from the solid semiconductor region, utilizing the temperature gradient which develops on the inside of the semiconductor layer. Therefore crystal grains having a large grain size can be obtained in the region A.

A crystalline semiconductor film 43 formed by irradiating the laser beam as above can then have any remaining defects neutralized by performing heat treatment in an atmosphere containing from 3 to 100% hydrogen between 300 and 450° C., or by performing heat treatment between 200 and 450° C. in an atmosphere containing hydrogen generated by a plasma.

By manufacturing a TFT with a region 44 within the crystalline semiconductor film 41 thus produced, in which large grain size crystal grains are formed as shown in the top surface diagram of FIG. 7D, and by using the region 44 as a channel forming region or an active region, the electrical properties of the TFT can be improved.

[Embodiment 3]

An embodiment of the present invention is explained using the cross sectional diagrams of FIGS. 8A to 9C. Note that a top surface diagram is also given along with a cross sectional diagram for FIGS. 8B and 9C.

Figure 8A:
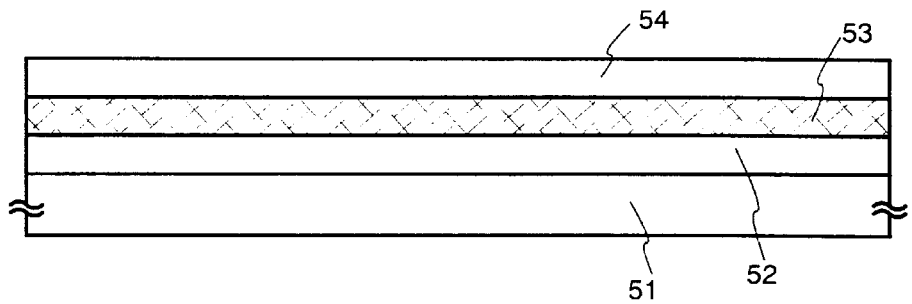
FIGS. 8A to 8D are diagrams showing the example of the method disclosed by the present invention of forming a position controlled crystal grain at a large grain size.
Figure 8B:
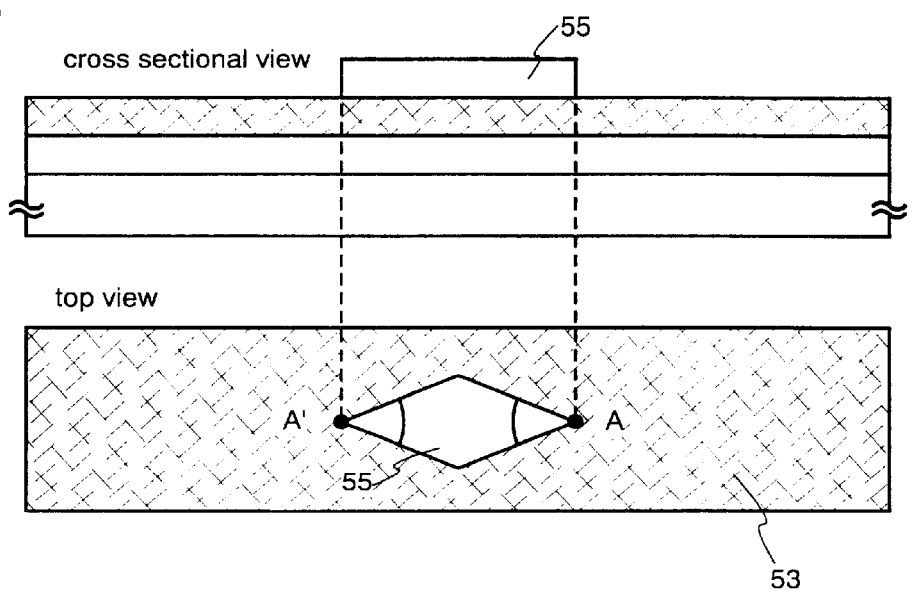
Figure 8C:
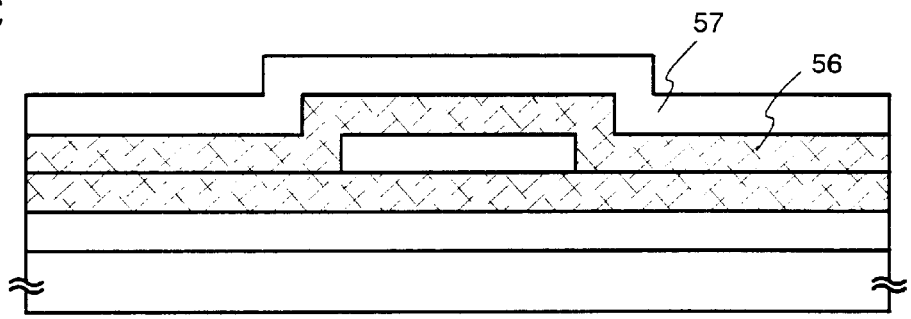

A synthetic quartz glass substrate, non-alkaline glass substrate such as barium borosilicate glass or aluminum borosilicate glass, or a transparent film such as PC (polycarbonate), PAr (polyallylate), PES (polyether sulfone), or PET (polyethylene terephthalate) may be used as a substrate 51 in FIG. 8A. For example, a glass such as Corning Corp. 7059 glass or 1737 glass can be suitably used.

A base insulating film 52 made from a film such as silicon nitride, silicon oxynitride, or silicon oxide is formed with a thickness of 10 to 200 nm (preferable from 10 to 100 nm) on the substrate 51 by a known method (LPCVD, plasma CVD, and the like). A silicon oxynitride film having a film thickness of 50 nm (composition ratios: Si=32%; O=27%; N=24%; H=17%) is formed in embodiment 3.

A first semiconductor film 53 shown in FIG. 8A is formed having a thickness from 10 to 200 nm (preferably from 10 to 100 nm) on the base insulating film 52 by a known method such as plasma CVD or sputtering. Note that amorphous semiconductor films, microcrystalline semiconductor films, or polycrystalline semiconductor films may be used as the first semiconductor film 53, and that a chemical compound semiconductor film having an amorphous structure, such as an amorphous silicon germanium film, may also be applied. Plasma CVD is used in embodiment 3, and a 55 nm thick amorphous silicon film is formed.

A first insulating film 54 is formed with a thickness of 10 to 200 nm (preferably from 10 to 100 nm) from a film such as a silicon nitride film, a silicon oxynitride film, or a silicon oxide film on the first semiconductor film 53 by a known process (such as LPCVD or plasma CVD). It is preferable that the film thickness of the first insulating film 54 be the same as the film thickness of a second insulating layer 58, formed by a later process, or that the film have a thinner film thickness. This is so that a temperature gradient will easily develop within the semiconductor film when a laser beam is irradiated. A silicon oxynitride film having a film thickness of 50 nm (composition ratios: Si=32%; O=27%; N=24%; H=17%) is formed in embodiment 3. A resist mask is formed by a photolithography technique after forming the first insulating film 54, and unnecessary portions are etched to form an insulating layer 55.

The top surface shape of the insulating layer 55 is a polygonal shape, and the angle of at least one vertex of the polygonal shape is less than 60°. The vertex having the angle less than 60° is hereafter referred to as the vertex A. The angle of the vertex A is made less than 60° in order to reduce the density of nucleation sites within the semiconductor film existing below the insulating film 55 in the vicinity of the vertex A, and in order to prevent mutual collision of growing crystal grains upon the laser beam irradiation. The top surface shape of the insulating layer 55 is made into a quadrilateral shape in embodiment 3, and the quadrilateral shape is one having two vertices with a 45° angle.

A dry etching method using a fluoride gas, or a wet etching method using an aqueous fluoride solution may be used for the etching. If the wet etching method is selected, etching may be performed, for example, by a solution containing 7.13% ammonium hydrogen fluoride (NH$_4$HF$_2$) and 15.4% ammonium fluoride (NH$_4$F) (Stela-chemifa Corp; product name LAL500).

A second semiconductor film 56 is formed next by a known method such as plasma CVD or sputtering to a thickness of 10 to 200 nm (preferably from 10 to 100 nm). A 55 nm thick amorphous silicon film is formed using plasma CVD in embodiment 3. The insulating film 55 which is sandwiched between the first semiconductor film 53 and the second semiconductor film 56 is hereafter referred to as an embedded insulating layer 55.

A second insulating film 57 is then formed by a known method (such as LPCVD or plasma CVD) along the second semiconductor film 56 from a film such as a silicon nitride film, a silicon oxynitride film, or a silicon oxide film. It is preferable that the film thickness of the second insulating film 57 be such that its reflectivity is low with respect to the wavelength of the laser beam used when performing laser annealing, as shown in FIG. 1A and in FIG. 2A. The second insulating film 57 thus acts effectively as an anti-reflective film and as a thermally insulating film. A silicon oxynitride film having a film thickness of 50 nm (composition ratios: Si=32%; O=27%; N=24%; H=17%) is formed in embodiment 3.

Figure 8D:
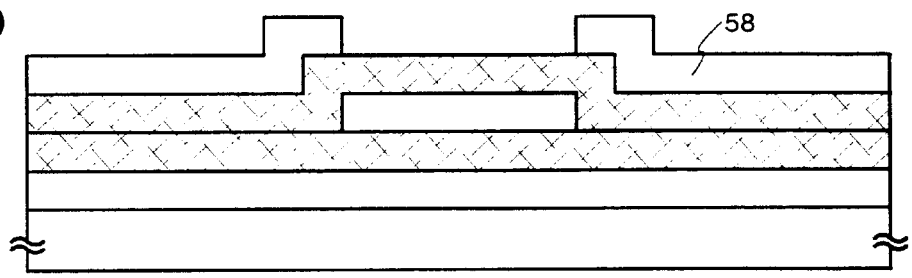

An insulating layer 58 is formed by forming a resist mask using a photolithography technique, and etching unnecessary portions, after formation of the second insulating film 57. The insulating layer 58 may be formed by etching only regions which overlap with the insulating layer embedded in the second insulating film 57. In addition, the insulating layer 58 may be formed in the second insulating film 57 without overlapping with the embedded insulating film 55, as shown in FIG. 8D, such that the vertex A or a vertex A' of the embedded insulating film 55 and the end surface of the insulating layer 58 coincide through the second semiconductor film 56.

Figure 9A:
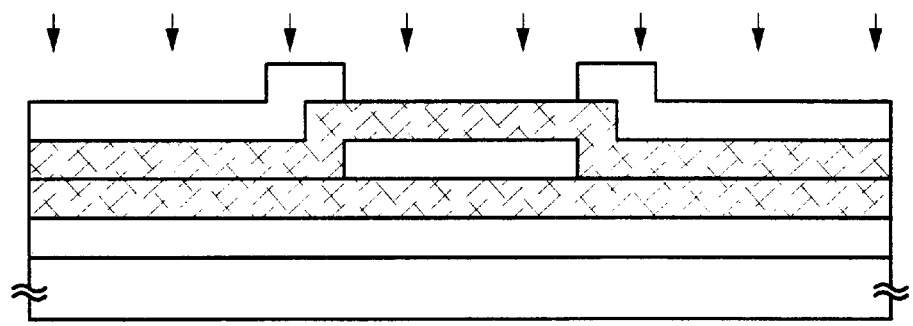
FIGS. 9A to 9C are diagrams showing the example of the method disclosed by the present invention of forming a position controlled crystal grain at a large grain size.
Figure 9B:
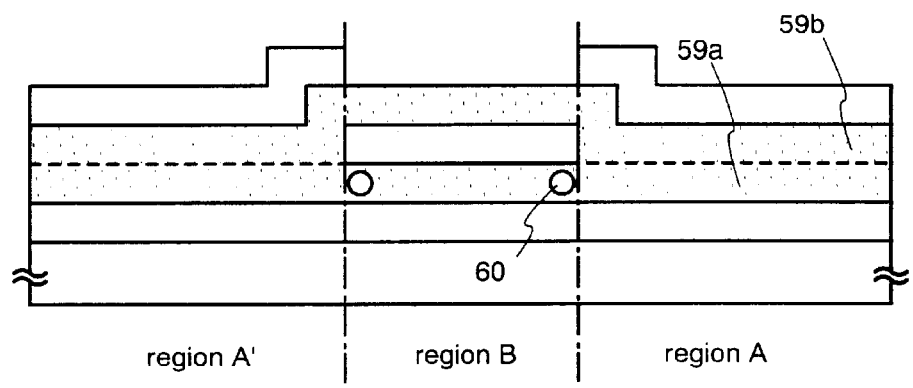

FIG. 9A is a diagram for explaining a crystallization process in which a laser beam is irradiated form the top surface of the substrate. It is preferable that hydrogen contained in the semiconductor film be removed first in the laser annealing crystallization method, and the amount of contained hydrogen may be made equal to or less than 5 atom % by exposing the semiconductor film to a 400 to 500° C. hydrogen atmosphere for on the order of one hour. The resistance of the film to the laser is thus raised substantially.

A laser emission apparatus used in the laser annealing method is explained. Excimer lasers are often used because they have high output, and high frequency pulses on the order of 300 Hz can be emitted at present. In addition to the pulse emission excimer laser, lasers such as a continuous emission excimer laser, an Ar laser, a YAG laser, a YVO$_4$laser, a YAlO$_3$laser, and a YLF laser can also be used. Further, the laser beam irradiation can be performed in environments such as within a vacuum, within the atmosphere, and within a nitrogen atmosphere. The substrate may also be heated up to the temperature on the order of 500° C., when performing laser beam irradiation. The heat flow speed in the semiconductor film can thus be expected to be reduced, and the grain size of the grains can be enlarged.

Crystallization of the first semiconductor film 53 and the second semiconductor film 56 is performed by irradiation of a laser beam from the top surface side of the substrate shown in FIG. 9A, using a pulse emission XeCl excimer laser in the atmosphere, and at a substrate temperature of room temperature, in embodiment 3.

Figure 9C:
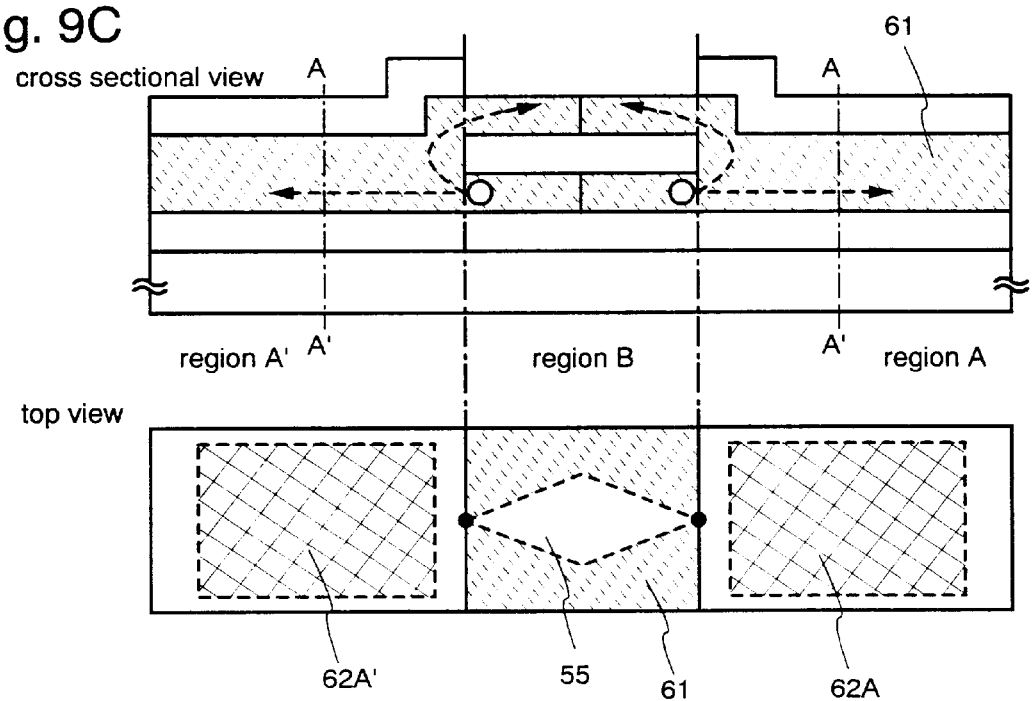

Regions containing the insulating layer 58 are taken as the region A and a region A', and the region containing the embedded insulating layer 55 is taken as the region B, as shown in FIGS. 9C and 9D, with both ends of the embedded insulating layer 55 used as a boundary.

The first semiconductor film 53 and the second semiconductor film 56 are placed in a melted state by irradiating the laser beam. The first semiconductor film 53 is referred to as a first semiconductor film 59a after being irradiated by the laser beam, and the second semiconductor film 56 is referred to as a second semiconductor film 59b after being irradiated by the laser beam. The first semiconductor film 59a is irradiated by the laser beam through the second semiconductor film 59b and the embedded insulating layer 55, and therefore it cools quickly in comparison with the second semiconductor film 59b, which is directly irradiated by the laser beam. Crystal nuclei 60 thus form first within the first semiconductor film 41a. (See FIG. 9C.) Further, the first semiconductor film 59a of the region B is sandwiched by the embedded insulating layer 55 and the base insulating film 52, and its cooling speed becomes slower due to the thermal insulating effect of the embedded insulating layer 55 and of the base insulating film 52. However, the first semiconductor film 59a cools with passing time, and crystal nuclei develop. A distribution of the crystal nuclei 60 corresponding to the shape of the embedded insulating layer 55 develops at this point in the first semiconductor film 59a of the region B. In particular, the angle of the vertex A and the angle of the vertex A' of the embedded insulating layer 55 are narrow at less than 60°, and therefore the concentration of the crystal nuclei 60 formed becomes low within the first semiconductor film 53 existing below in the vicinity of the vertex A, and in the vicinity of the vertex A'.

On the other hand, the first semiconductor film 59a and the second semiconductor film 59b of the region A and the region A' are sandwiched by the insulating layer 58 having low laser beam reflectivity and having a thermal insulating effect, and by the base insulating film 52 having a thermal insulating effect, and therefore the melted state is maintained for a longer time than that of the region B. Temperature gradients therefore develop between the region A and the region B, or between the region A' and the region B, and a solid-liquid interface at the crystal growth tip moves from the low temperature region B to the high temperature region A, or from the low temperature region B to the high temperature region A'. The crystal nuclei which develop within the first semiconductor film 59a existing under the embedded insulating layer 55 and in the vicinity of the vertex A of the embedded insulating layer 55 thus have crystal growth toward the region A, and large size grains can be obtained in the region A. Similarly, the crystal nuclei which develop within the first semiconductor film 59a existing under the embedded insulating layer 55 and in the vicinity of the vertex A' of the embedded insulating layer 55 thus have crystal growth toward the region A', and large size grains can be obtained in the region A'.

Further, if the first semiconductor film 59a in the region B is not completely melted by the laser beam irradiation, and solid semiconductor regions partially remain, then immediately after laser beam irradiation crystal growth proceeds in the direction of the region A, or in the direction of the region A', from the solid semiconductor region, utilizing the temperature gradients which develop on the inside of the semiconductor layer. Therefore crystal grains having a large grain size can be obtained in the region A and in the region A'.

A crystalline semiconductor film 61 formed by irradiating the laser beam as above can then have any remaining defects neutralized by performing heat treatment in an atmosphere containing from 3 to 100% hydrogen between 300 and 450° C., or by performing heat treatment between 200 and 450° C. in an atmosphere containing hydrogen generated by a plasma.

By manufacturing a TFT with regions 62A and 62A' within the crystalline semiconductor film 61 thus produced, in which large grain size crystal grains are formed as shown in the top surface diagram of FIG. 9C, and by using the regions 62A and 62A' as channel forming regions or active regions, the electrical properties of the TFT can be improved.

[Embodiment 4]

A method of manufacturing a pixel portion and driver circuit TFTs (an n-channel TFT and a p-channel TFT), formed in the periphery of the pixel portion, at the same time and on the same substrate is explained in detail here using FIGS. 10A to 13. A substrate on which a driver circuit, and a pixel portion having a pixel TFT and a storage capacitor, are formed on the same substrate is referred to as an "active matrix substrate" in this specification, for convenience.

A crystalline semiconductor film (shown by FIG. 10A) is obtained in accordance with any of the methods of embodiment 1, embodiment 2, and embodiment 3. A method of manufacturing a TFT corresponding to the cross section of FIG. 10A, and to the cross section cut along the dashed line A-A' of FIG. 4D, FIG. 7D, or FIG. 9C is explained in embodiment 4, but a TFT can also be manufactured using the same cross section as that of the cross sections used when forming the crystalline semiconductor films of embodiment 1, embodiment 2, or embodiment 3.

The crystalline semiconductor film is first formed into a predetermined shape by patterning. Semiconductor layers 402 to 406 are formed in embodiment 4 in accordance with a patterning process using photolithography on the crystalline semiconductor film.

Further, doping of a very small amount of an impurity element (boron or phosphorus) may be performed after forming the semiconductor layers 402 to 406 in order to control the TFT threshold voltage.

A gate insulating film 407 is formed next, covering the semiconductor layers 402 to 406. An insulating film already formed on the semiconductor layers may also be utilized as the gate insulating film. If the film thickness of the insulating film is the desired film thickness of the gate insulating film, it can be utilized as is, and if the film thickness is thicker than the desired value, the insulating film is made thinner by etching. Furthermore, if the film thickness of the insulating film is thinner than the desired film thickness, then etching is performed and the gate insulating film 407 is then formed at the desired film thickness. The gate insulating film 407 is formed by an insulating film containing silicon with a thickness of 40 to 150 nm using plasma CVD or sputtering. In embodiment 4, the already formed insulating film (corresponding to reference numeral 18, 40, or 48) is etched, and a silicon oxynitride film having a film thickness of 110 nm (composition ratios: Si=32%; O=59%; N=7%; H=2%) is formed. The gate insulating film is of course not limited to a silicon oxynitride film, and other insulating films containing silicon may be used in a single layer or in a lamination structure.

Further, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 W/cm². Good characteristics as a gate insulating film can be obtained by subsequently performing thermal annealing, between 400 and 500° C., of the silicon oxide film thus manufactured.

Figure 10A:
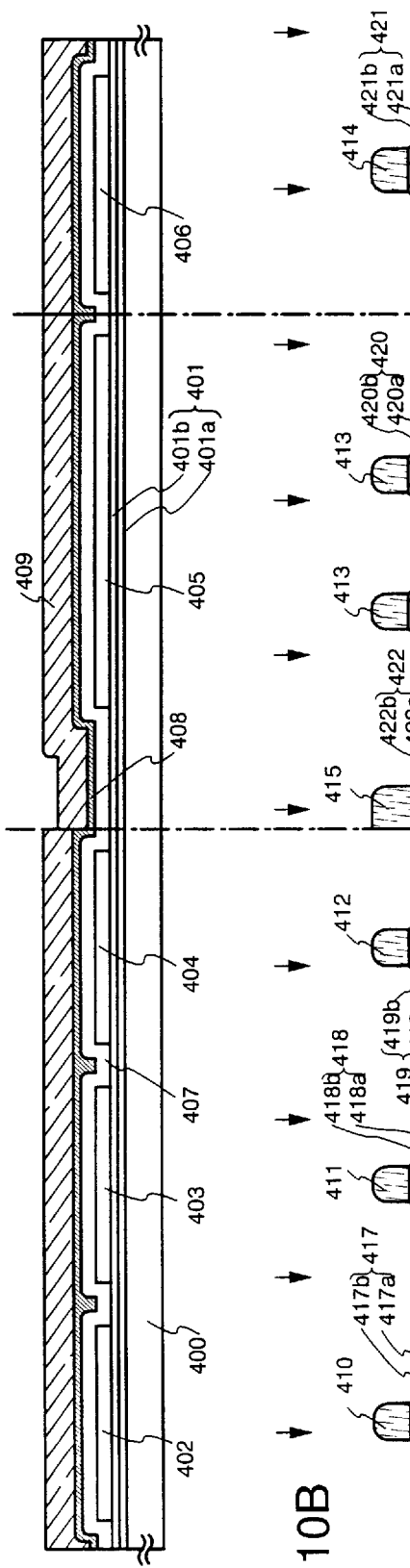
FIGS. 10A to 10C are cross sectional diagrams showing a process of manufacturing a pixel TFT and a driver circuit TFT.

A first conductive film 408 having a film thickness of 20 to 100 nm, and a second conductive film 409 having a film thickness of 100 to 400 nm are then formed on the gate insulating film 407, as shown in FIG. 10A. The first conductive film 408, made from a 30 nm thick TaN film, and the second conductive film 409, made from a 370 nm thick W film, are formed and laminated in embodiment 4. The TaN film is formed by sputtering, and sputtering of a Ta target is performed in a nitrogen atmosphere. Further, the W film is formed by sputtering using a W target. In addition, the W film can also be formed by thermal CVD using tungsten hexafluoride ($WF_6$). Whichever is used, it is necessary to be able to make the film become low resistance in order to use it as a gate electrode, and it is preferable that the resistivity of the W film be made equal to or less than 20 $\mu\Omega$cm. The resistivity can be lowered by enlarging the crystal grains of the W film, but for cases in which there are many impurity elements such as oxygen within the W film, crystallization is inhibited, and the film becomes high resistance. A high purity W target (99.9999% purity) is therefore used in sputtering. In addition, by forming the W film while taking sufficient care that no impurities from within the gas phase are introduced at the time of film formation, a resistivity of 9 to 20 $\mu\Omega$cm can be achieved.

Note that, although the first conductive film 408 is TaN and the second conductive film 409 is W in embodiment 4, the conductive films are not limited to these. The first conductive film 408 and the second conductive film 409 may both also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a poly-silicon film, into which an impurity element such as phosphorus is doped may also be used, as may an AgPdCu alloy. Examples of combinations other than that used in embodiment 4 include: forming the first conductive film 408 by a tantalum (Ta) film and combining it with the second conductive film 409 formed from a W film; forming the first conductive film 408 by a titanium nitride (TiN) film and combining it with the second conductive film 409 formed from a W film; forming the first conductive film 408 by a tantalum nitride (TaN) film and combining it with the second conductive film 409 formed from an Al film; and forming the first conductive film 408 from a tantalum nitride (TaN) film and combining it with the second conductive film 409 formed by a Cu film.

Masks 410 to 415 are formed next from photo-resist using photolithography, and a first etching process is performed in order to form electrodes and wirings. The first etching process is preformed under first and second etching conditions. An ICP (inductively coupled plasma) etching method is used in embodiment 4 as the first etching condition. A gas mixture of $CF_4$, $C_2$, and $O_2$ is used as an etching gas, the gas flow rates are set to 25/25/10 sccm, respectively, a plasma is generated by applying a 500 W RF electric power (13.56 MHz) to a coil shape electrode at 1 Pa, and etching is performed. A Matsushita Electric Inc. Dry etching apparatus (model E645-□ICP) using ICP is employed. A 150 W RF electric power (13.56 MHz) is also applied to the substrate side (test piece stage), effectively applying a negative self-bias. The W film is etched under the first etching conditions, and the edge portion of the first conductive layer is made into a tapered shape. The etching speed of W is 200.39 nm/min, and the etching speed of TaN is 80.32 nm/min, resulting in a selectivity of W with respect to TaN of approximately 2.5. Further, the taper angle of W becomes approximately 26° under the first etching conditions.

The etching conditions are changed to the second etching condition without removing the resist masks 410 to 415. A gas mixture of $CF_4$ and $Cl_2$ is used as an etching gas, the gas flow rates are set to 30/30 sccm, respectively, a plasma is generated by applying a 500 W RF electric power (13.56 MHz) to a coil shape electrode at 1 Pa, and etching is performed for approximately 30 seconds. A 20 W RF electric power (13.56 MHz) is also applied to the substrate side (test piece stage), effectively applying a negative self-bias. The W film and the TaN film are both etched by on the same order by the second etchings conditions using the $CF_4$ and $Cl_2$ gas mixture. Note that in order for etching to be performed such that nothing remains on the gate insulating film, the etching time may be increased on the order of 10 to 20%.

Edge portions of the first conductive layer and the second conductive layer are made into a tapered shape in accordance with the effect of the bias voltage applied to the substrate side with the above etching conditions by using a suitable resist mask shape. The angle of the tapered portions is from 15 to 45°. First shape conductive layers 417 to 422 (first conductive layers 417a to 422a, and second conductive layers 417b to 422b) are thus formed from the first conductive layers and the second conductive layers by the first etching process. Reference numeral 416 denotes the gate insulating film, and regions not covered by the first shape conductive layers 417 to 422 are formed into regions which become thinner by approximately 20 to 50 nm after etching.

Figure 10B:
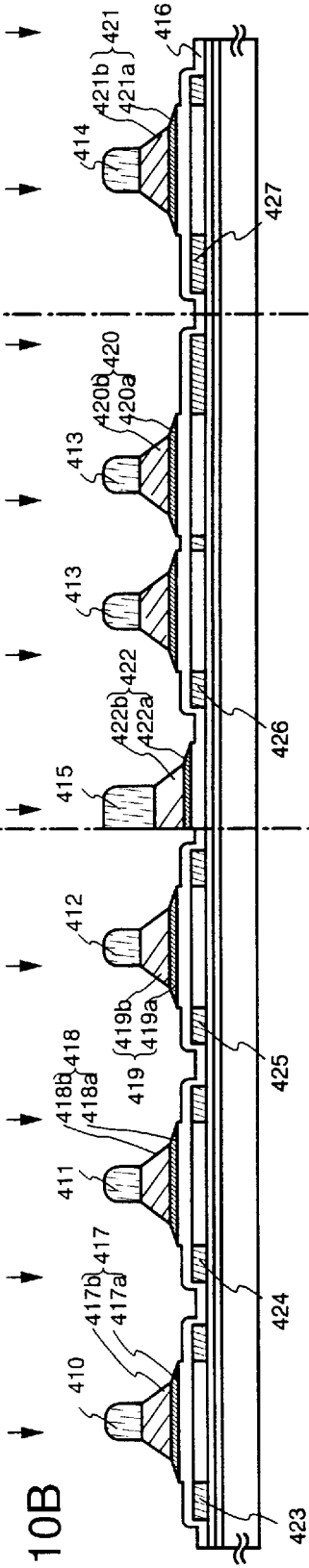

A first doping process is then performed without removing the resist masks, adding an impurity element which imparts n-type conductivity (see FIG. 10B). The doping process may be performed by ion doping or ion implantation. Ion doping is performed with process conditions in which the dosage is set from $1 \times 10^{13}$ to $5 \times 10^{15}$ atoms/cm², and the acceleration voltage is set between 60 to 100 keV. Doping is performed in embodiment 4 with the dosage set to $1.5 \times 10^{15}$ atoms/cm$^2$, and the acceleration voltage set to 80 keV. An element residing in group 15 of the periodic table, typically phosphorus (P) or arsenic (As) is used as an impurity element which imparts n-type conductivity, and phosphorus (P) is used here. In this case the conductive layers 417 to 421 act as masks with respect to the n-type conductivity imparting impurity element, and high concentration impurity regions 423 to 427 are formed in a self-aligning manner. The impurity element which imparts n-type conductivity is added to the high concentration impurity regions 423 to 427 at a concentration in the range of $1 \times 10^{21}$ to $1 \times 10^{21}$ atoms/cm$^3$.

Figure 10C:
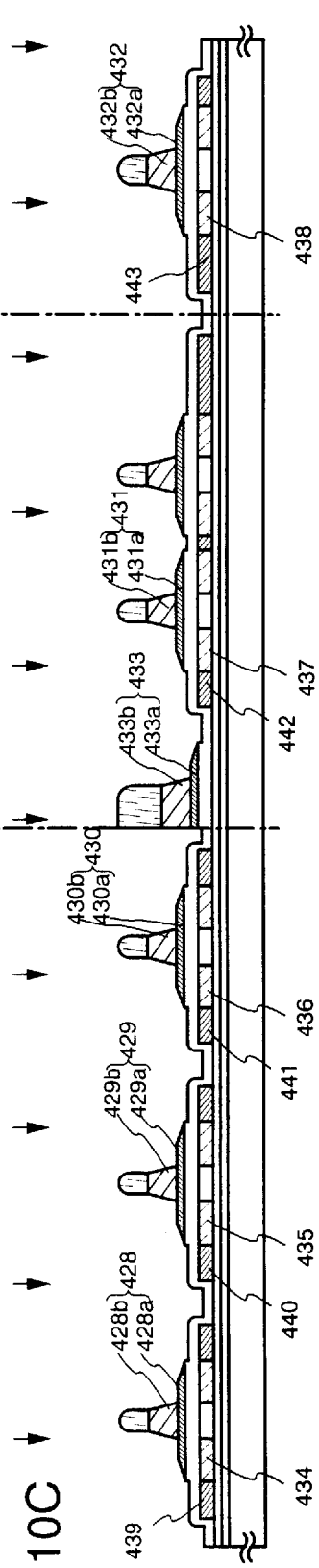
Figure 12:
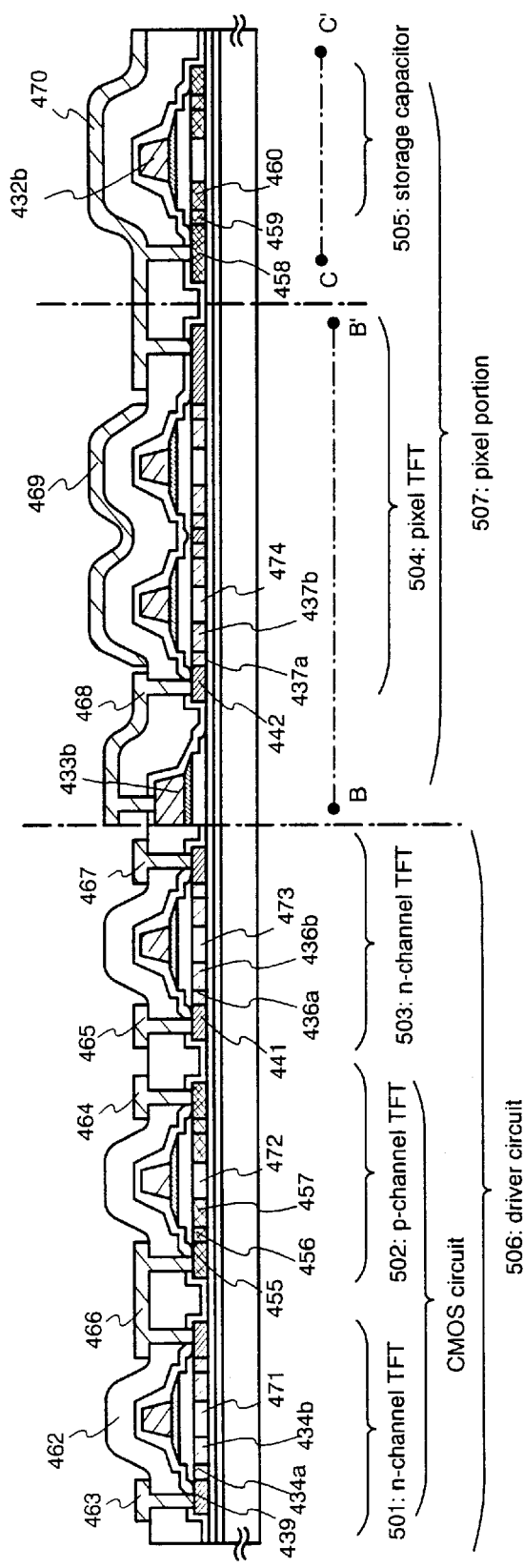
FIG. 12 is a cross sectional diagram showing the process of manufacturing a pixel TFT and a driver circuit TFT.

A second etching process is performed next without removing the resist masks. A mixture of $CF_4$, $Cl_2$, and $O_2$ is used as the etching gas, and W is selectively etched. First conductive layers 428b to 433b are formed by the second etching process. On the other hand, etching of the second conductive layers 417a to 422a is nearly nonexistent, forming second conductive layers 428a to 433a. A second doping process is performed next, and the state of FIG. 10C is obtained. The second conductive layers 417a to 422a are used as masks with respect to an impurity element during doping, and doping is performed such that the impurity element is added to the semiconductor layers under the tapered portions of the first conductive layers. Impurity regions 434 to 438 which overlap with the first conductive layers are thus formed. The concentration of phosphorus (P) added to the impurity regions has a gradual concentration gradient in accordance with the film thickness of the tapered portions of the first conductive layers. Note that although the impurity concentration becomes a little lower in the semiconductor layers overlapping with the tapered portions of the first conductive layers, from the edge of the tapered portions of the first conductive layers toward the inside, the concentration is nearly the same. Further, the impurity element is also added into the impurity regions 423 to 427, forming impurity regions 439 to 443.

A third etching process is performed next without removing the resist masks (see FIG. 11A). The tapered portions of the first conductive layers are partially etched by the third etching process, which is performed in order to reduce the size of the regions overlapping with the semiconductor layers. $CHF_3$ is used as the etching gas, and the third etching process is performed using reactive ion etching (RIE). First conductive layers 444 to 449 are formed in accordance with the third etching process. The insulating film 416 is also etching at the same time, forming insulating films 450a to 450d and 451.

Impurity regions (LDD regions) 434a to 438a not overlapping with the first conductive layers 444 to 448 are formed in accordance with the third etching process. Note that impurity regions (GOLD regions) 434b to 438b remain overlapping with the first conductive layers 444 to 448.

The difference between the impurity concentration in the impurity regions (GOLD regions) overlapping with the first conductive layers 444 to 448, and the impurity concentration in the impurity regions (LDD regions) 434a to 438a not overlapping with the first conductive layers 444 to 448 can thus be made smaller in embodiment 4, and reliability can be increased.

After removing the resist masks, new masks 452 to 454 made from resist are formed and a third doping process is performed. Impurity regions 455 to 460, to which an impurity element which imparts a conductivity type opposite that of the above single conductivity type is added, are formed from the semiconductor layers which become active layers of the p-channel TFT in accordance with the third doping process. The second conductive layers 428a to 432a are used as masks with respect to the impurity element, and an impurity element which imparts p-type conductivity is added, forming the impurity regions in a self-aligning manner. The impurity regions 455 to 460 are formed by ion doping using diborane ($B_2H_6$) in embodiment 4 (see FIG. 11B). The semiconductor layers for forming the n-channel TFT are covered by the resist masks 452 to 454 when performing the third doping process. Phosphorus is added at differing concentrations into the impurity regions 455 to 460 by the first doping process and by the second doping process, but by performing doping such that the concentration of the p-type conductivity imparting impurity element becomes from $2 \times 10^{20}$ to $2 \times 10^{21}$ atoms/cm$^3$ in each of the regions, no problems will develop in making the regions function as source regions and drain regions of the p-channel TFT. Embodiment 4 has an advantage in that portions of the semiconductor layers which become the active layers of the p-channel TFT are exposed, and therefore the impurity element (boron) is easily added.

The impurity regions are thus formed in the various semiconductor layers by the processes up to this point.

A first interlayer insulating film 461 is formed next after removing the resist masks 452 to 454. The first interlayer insulating film 461 is formed from an insulating film containing silicon, having a thickness of 100 to 200 nm, by using plasma CVD or sputtering. A 150 nm thick silicon oxynitride film is formed by plasma CVD in embodiment 4. The first interlayer insulating film 461 is of course not limited to a silicon oxynitride film, and other insulating films containing silicon may also be used, as a single layer or a lamination structure.

A process of activating the impurity elements added to the respective semiconductor layers is performed next, as shown in FIG. 11C. Thermal annealing using an annealing furnace is performed for this process. Thermal annealing is performed with an oxygen concentration equal to or less than 1 ppm, preferably equal to or less than 0.1 ppm, in a nitrogen environment at 400 to 700° C., typically between 500 and 550° C. Heat treatment is performed for 4 hours at 550° C. in embodiment 4. Note that, in addition to thermal annealing, laser annealing and rapid thermal annealing (RTA) can also be applied.

If crystalline semiconductor films obtained in embodiment 2 are used, then the nickel used as a catalyst when performing crystallization is gettered into the high concentration phosphorus containing impurity regions 439, 441, 442, 455, and 458 at the same time as the activation takes place, and the nickel concentration is reduced mainly within the semiconductor layers which become channel forming regions. The value of the off current is lowered for a TFT having a channel forming region thus manufactured, and a high electric field mobility can be obtained due to good crystallinity. Thus good properties can be achieved.

Further, activation processing may also be performed before the formation of the first interlayer insulating film 461. However, if the wiring material used is weak with respect to heat, it is preferable to perform activation after forming an interlayer insulating film (an insulating film having silicon as its main constituent, for example a silicon nitride film) in order to protect the wirings and the like, as in embodiment 4.

In addition, heat treatment is performed for 1 to 12 hours at 300 to 450° C. in an atmosphere containing between 3 and 100% hydrogen, performing hydrogenation of the semiconductor layers. In embodiment 4, the heat treatment is performed for 1 hour at 410° C. in a nitrogen atmosphere containing about 3% hydrogen. This process is one of terminating dangling bonds in the island shape semiconductor layers by hydrogen contained within the first interlayer insulating film 461. Plasma hydrogenation (using hydrogen excited by a plasma) may also be performed as another means of hydrogenation.

Further, if laser annealing is used as the activation process, then it is preferable to irradiate the laser beam, such as that of an excimer laser or a YAG laser, after performing the hydrogenation process.

A second interlayer insulating film 462 made from an inorganic insulating material or from an organic insulating material is formed next on the first interlayer insulating film 461. An acrylic resin film having a film thickness of 1.6 $\mu$m is formed in embodiment 4, and the material used may have a viscosity from 10 to 1000 cp, preferably between 40 and 200 cp. A material in which unevenness is formed on its surface is used.

In order to prevent specular reflection, the surface of a pixel electrode is made uneven by forming the second interlayer insulating film from a material which forms an uneven surface in embodiment 4. Further, the electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed suitably on the substrate pixel portion region outside of the wirings and TFTs. Unevenness is formed in the surface of the pixel electrode along the unevenness formed in the surface of the insulating film which covers the convex portion.

A film having a level surface may also be used as the second interlayer insulating film 462. In this case, after the formation of the pixel electrodes, it is preferable that the surface be made uneven by an added process such as a known sandblast process or etching process, preventing specular reflection, and increasing the whiteness by scattering reflected light.

Wirings 463 to 467 for electrically connecting the various impurity regions are then formed in a driver circuit 506 in order. Note that a lamination film of a 50 nm thick Ti film and a 500 nm thick alloy film (an alloy of Al and Ti) is patterned for forming the wirings.

Furthermore, a pixel electrode 470, a gate wiring 469, and a connection electrode 468 are formed in a pixel portion 507. (See FIG. 12.) An electrical connection is formed with the pixel TFT 504 and the source wiring (lamination of the impurity regions 443b and 449) by the connection electrode 468. Further, the gate wiring 469 forms an electrical connection with the gate electrode of the pixel TFT 504. The pixel electrode 470 forms an electrical connection with the drain region 442 of the pixel TFT, and in addition, forms an electrical connection with the semiconductor layer 458 which functions as one electrode forming the storage capacitor. It is preferable to use a material having superior reflectivity, such as a film having Al or Ag as its main constituent, or a lamination film of such films, as the pixel electrode 471.

A CMOS circuit composed of an n-channel TFT 501 and a p-channel TFT 502, a driver circuit 506 having an n-channel TFT 503, and the pixel portion 507 having a pixel TFT 504 and a storage capacitor 505 can thus be formed on the same substrate. The active matrix substrate is thus completed.

The n-channel TFT 501 of the driver circuit 506 has: a channel forming region 471; the low concentration impurity region 434b (GOLD region) which overlaps with the first conductive layer 444 that constitutes a portion of the gate electrode; the low concentration impurity region 434a (LDD region) formed on the outside of the gate electrode; and the high concentration impurity region 439 which functions as a source region or a drain region. The p-channel TFT 502, which forms the CMOS circuit with the n-channel TFT 501 by an electrical connection through the electrode 466, has: a channel forming region 472; the impurity region 457 which overlaps with the gate electrode; the impurity region 458 which is formed on the outside of the gate electrode; and the high concentration impurity region 455 which functions as a source region or a drain region. Further, the n-channel TFT 503 has: a channel forming region 473; the low concentration impurity region 436b (GOLD region) which overlaps with the first conductive layer 446 that constitutes a portion of the gate electrode; the low concentration impurity region 437a (LDD region) which is formed on the outside of the gate electrode; and the high concentration impurity region 441 which functions as a source region or a drain region.

The pixel TFT 504 of the pixel portion has: a channel forming region 474; the low concentration impurity region 437b (GOLD region) which overlaps with the first conductive layer 447 that constitutes a portion of the gate electrode; the low concentration impurity region 437a (LDD region) formed on the outside of the gate electrode; and the high concentration impurity region 443 which functions as a source region or a drain region. Further, a p-type impurity element is added to the semiconductor layers 458 to 460 which function as one electrode of the storage capacitor 505. The storage capacitor 505 is formed by an electrode (lamination of the conductive layer 448 and the region 432b) and the semiconductor layers 458 to 460, with the insulating film 451 functioning as a dielectric.

The edge portions of the pixel electrodes are arranged so as to overlap the source wirings such that gaps between the pixel electrodes are shielded without using a black matrix with the pixel structure of embodiment 4.

Figure 13:
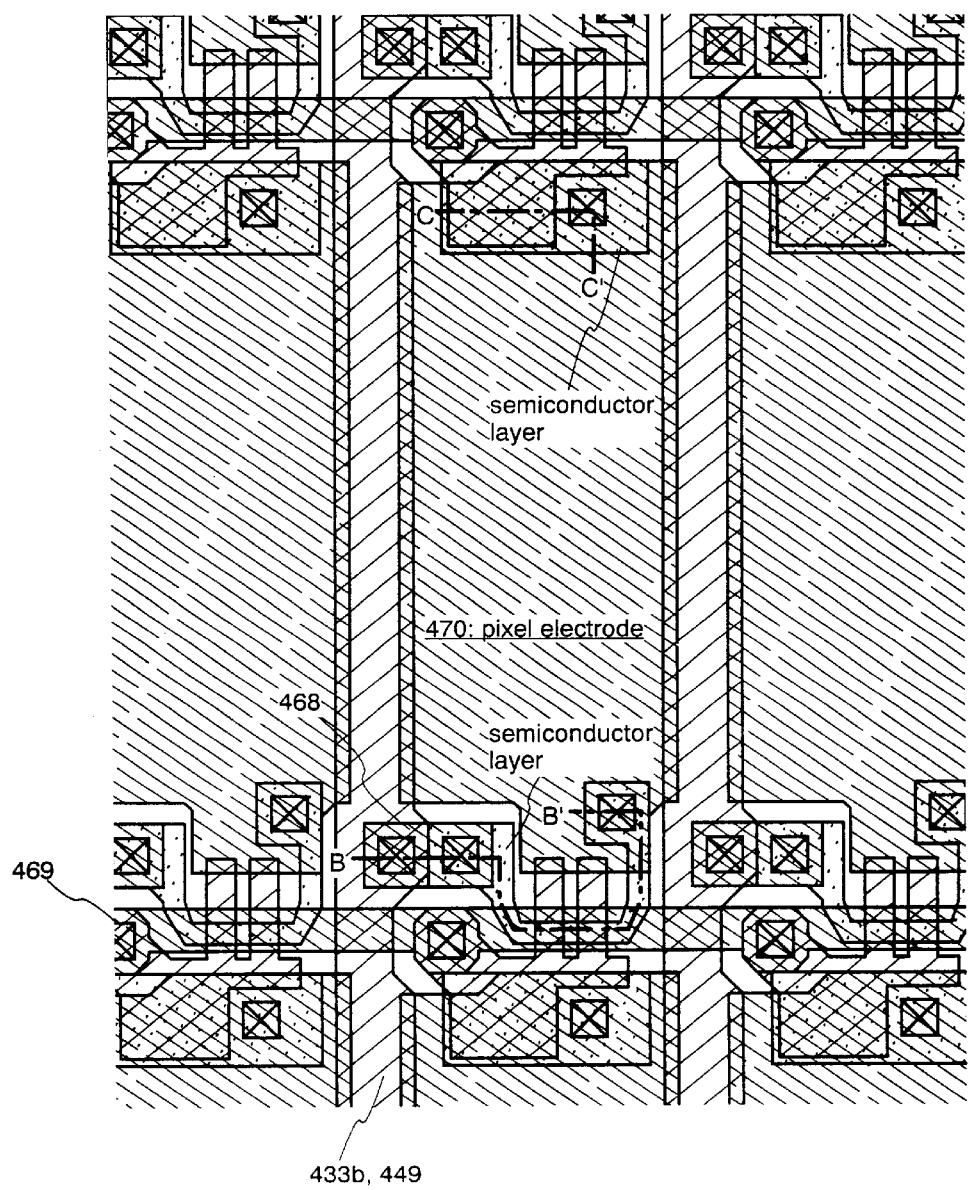
FIG. 13 is a cross sectional diagram showing a pixel TFT structure.

A top surface diagram of the pixel portion of the active matrix substrate manufactured by embodiment 4 is shown in FIG. 13. Note that portions corresponding to those of FIGS. 10A to 12 use the same reference numerals. The dashed line B-B' of FIG. 12 corresponds to a cross sectional diagram of FIG. 13 cut along the dashed line B-B', and the dashed line C-C' of FIG. 12 corresponds to a cross sectional diagram of FIG. 13 cut along the dashed line C-C'.

The number of photo-masks required to manufacture the active matrix substrate can be set to five in accordance with the processes shown by embodiment 4. As a result, the number of process steps can be reduced, and this can contribute to a lowering of the manufacturing cost and increased yield ratio.

[Embodiment 5]

Figure 14:
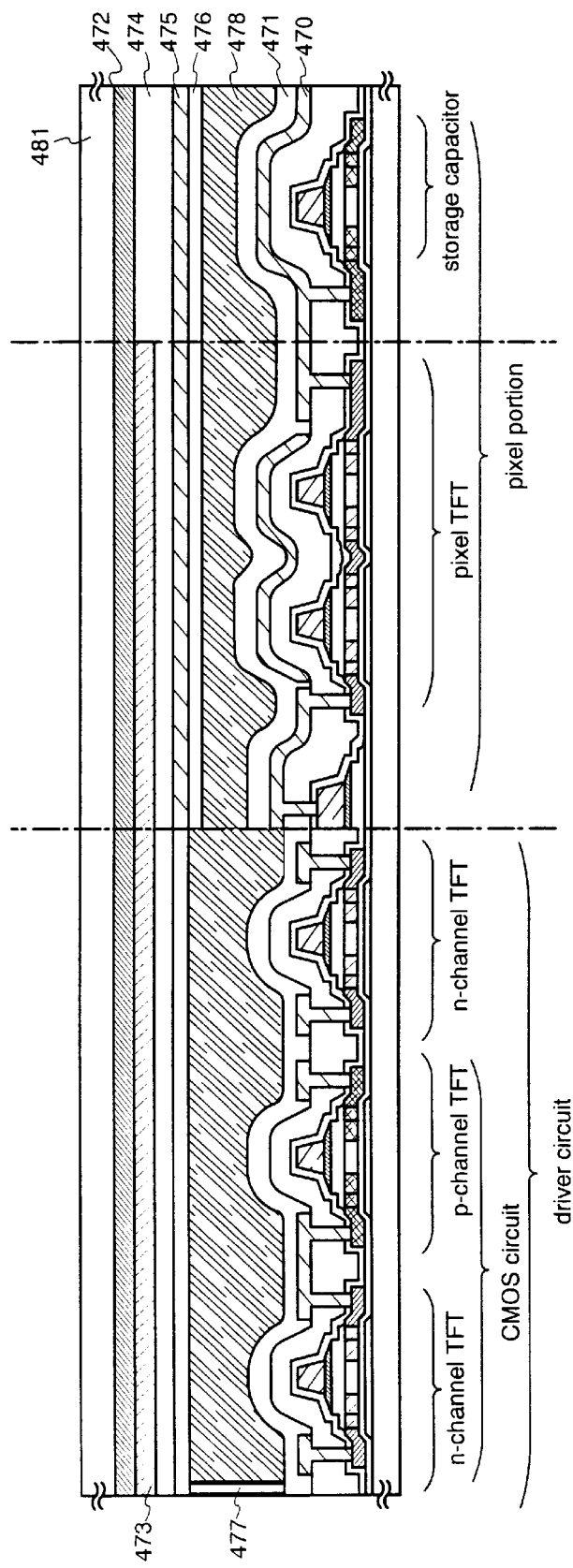
FIG. 14 is a cross sectional diagram showing a process of manufacturing an active matrix liquid crystal display device.

A process of manufacturing a reflecting type liquid crystal display device from the active matrix substrate manufactured by embodiment 4 is explained below in embodiment 5. FIG. 14 is used in the explanation.

An active matrix substrate in the state of FIG. 11C is first obtained in accordance with embodiment 4, and then an alignment film 471 is formed on at least the pixel electrode 470 on the active matrix substrate of FIG. 11C, and a rubbing process is performed. Note that, before forming the alignment film 471 in embodiment 5, column shaped spacers (not shown in the figure) are formed in predetermined positions by patterning an organic resin film, such as an acrylic resin film, in order to maintain a gap between substrates. Further, spherical shape spacers may also be distributed over the entire surface of the substrate as a substitute for the column shaped spacers.

An opposing substrate 481 is prepared next. Coloring layers 472 and 473, and a leveling film 474 are then formed on the opposing substrate 481. The red coloring layer 472 and the blue coloring layer 473 are overlapped, forming a light shielding portion. Furthermore, the light shielding portion may also be formed by overlapping a portion of the red coloring layer with a green coloring layer.

The substrate shown in embodiment 4 is used in embodiment 5. Therefore, with the top surface diagram of the pixel portion of embodiment 4 shown in FIG. 13, the gap between the gate wiring 469 and the pixel electrode 470, the gap between the gate wiring 469 and the connection electrode 468, and the gate between the connection electrode 468 and the pixel electrode 470 are required at minimum to be shielded from light. Each of the coloring layers are arranged such that the light shielding portions made from the lamination of the light shielding layers are formed in positions which must be shielded from light, and then are joined to the opposing substrate.

It is thus made possible to reduce the number of process steps by performing light shielding of the gaps between the pixels by using the light shielding portions composed of the laminations of coloring layers, without forming a light shielding layer such as a black mask.

An opposing electrode 475 made from a transparent conductive film is formed on the leveling film 474 over at least the pixel portion, an alignment film 476 is formed over the entire surface of the opposing substrate, and a rubbing process is performed.

The active matrix substrate on which the pixel portion and the driver circuit are formed, and the opposing substrate are then joined by a sealing material 477. A filler is mixed into the sealing material 477, and the two substrates are joined while maintaining a uniform gap in accordance with the filler and the column shape spacers. A liquid crystal material 478 is then injected between both substrates, and the substrates are completely sealed by using a sealant. A known liquid crystal material may be used for the liquid crystal material 478. The reflecting type liquid crystal display device shown in FIG. 14 is thus completed. The active matrix substrate or the opposing substrate is then cut into a predetermined shape if necessary. In addition, a polarizing plate (not shown in the figure) is attached to only the opposing substrate. An FPC is then attached using a known technique.

A liquid crystal display panel thus manufactured can be used as a display portion in all types of electronic equipment.

[Embodiment 6]

The CMOS circuit and the pixel portion formed by implementing the invention can be used in various electro-optic apparatus (active matrix type liquid crystal display, active matrix type EC display). That is, the present invention can be implemented in all of electronic apparatus integrated with the electro-optic apparatus at display portions thereof.

As such electronic apparatus, there are pointed out a video camera, a digital camera, a projector (rear type or front type), a head mount display (goggle type display), a car navigation system, a car stereo, a personal computer, a portable information terminal (mobile computer, portable telephone or electronic book) and the like. Examples of these are shown in FIGS. 15, 16 and 17.

FIG. 15A shows a personal computer including a main body 3001, an image input portion 3002, a display portion 3003 and a keyboard 3004. The invention is applicable to the image input portion 3002, the display portion 3003 and other signal control circuits.

FIG. 15B shows a video camera including a main body 3101, a display portion 3102, a voice input portion 3103, operation switches 3104, a battery 3105 and an image receiving portion 3106. The invention is applicable to the display portion 3102 and other signal control circuits.

FIG. 15C shows a mobile computer including a main body 3201, a camera portion 3202, an image receiving portion 3203, an operation switch 3204 and a display portion 3205. The invention is applicable to the display portion 3205 and other signal control circuits.

FIG. 15D shows a goggle type display including a main body 3301, a display portion 3302 and an arm portion 3303. The invention is applicable to the display portion 3302 and other signal control circuits.

FIG. 15E shows a player using a record medium recorded with programs (hereinafter, referred to as record medium) including a main body 3401, a display portion 3402, a speaker portion 3403, a record medium 3404 and an operation switch 3405. The player uses DVD (Digital Versatile Disc) or CD as the record medium and can enjoy music, enjoy movie and carry out game or Internet. The invention is applicable to the display portion 3402 and other signal control circuits.

FIG. 15F shows a digital camera including a main body 3501, a display portion 3502, an eye contact portion 3503, operation switches 3504 and an image receiving portion (not illustrated). The invention is applicable to the display portion 3502 and other signal control circuits.

Figure 16A:
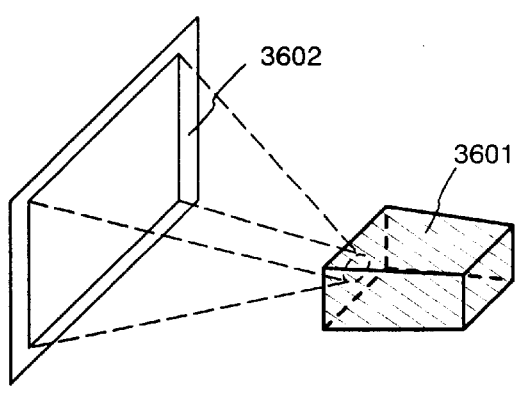
FIGS. 16A to 16D are diagrams showing examples of semiconductor devices.

FIG. 16A shows a front type projector including a projection apparatus 3601 and a screen 3602. The invention is applicable to a liquid crystal display apparatus 3808 constituting a portion of the projection apparatus 3601 and other signal control circuits.

Figure 16B:
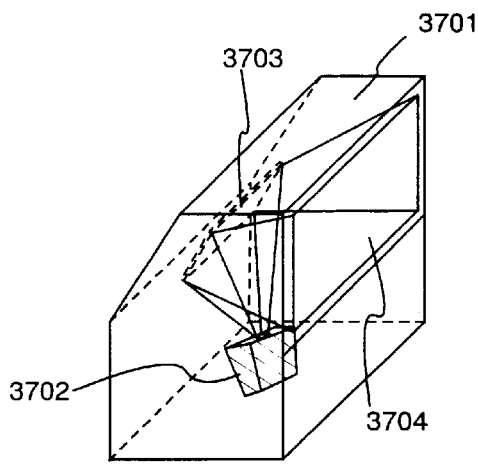

FIG. 16B shows a rear type projector including a main body 3701, a projection apparatus 3702, a mirror 3703 and a screen 3704. The invention is applicable to the liquid crystal display apparatus 3808 constituting a portion of the projection apparatus 3702 and other signal control circuits.

Figure 16C:
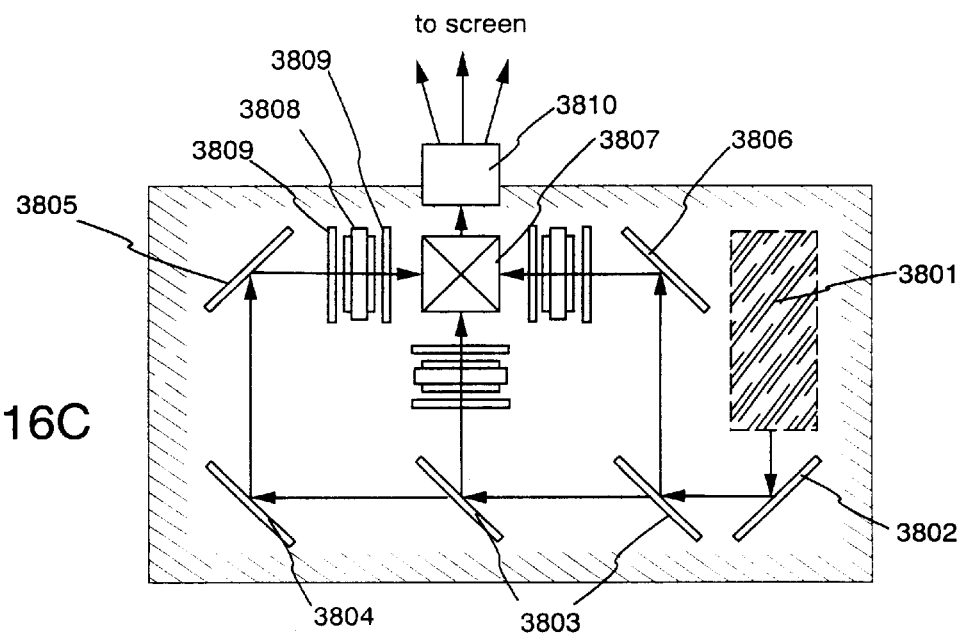

Further, FIG. 16C is a view showing an example of a structure of the projection apparatus 3601 and 3702 in FIG. 16A and FIG. 16B. The projection apparatus 3601 or 3702 is constituted by a light source optical system 3801, mirrors 3802, and 3804 through 3806, a dichroic mirror 3803, a prism 3807, a liquid crystal display apparatus 3808, a phase difference plate 3809 and a projection optical system 3810. The projection optical system 3810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 16C.

Figure 16D:
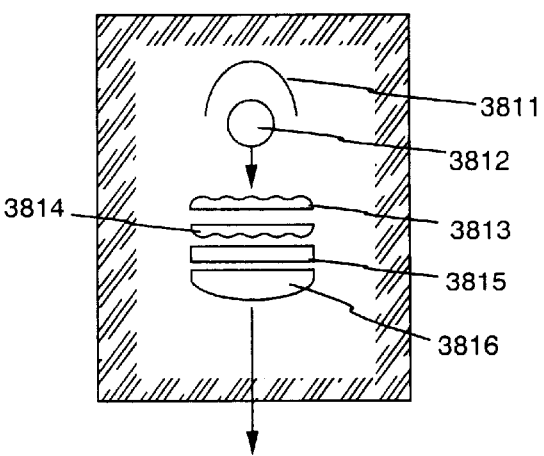

Further, FIG. 16D is a view showing an example of a structure of the light source optical system 3801 in FIG. 16C. According to the embodiment, the light source optical system 3801 is constituted by a reflector 3811, a light source 3812, lens arrays 3813 and 3814, a polarization conversion element 3815 and a focusing lens 3816. Further, the light source optical system shown in FIG. 16D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIGS. 16A and 16B, there is shown a case of using a transmission type electro-optic apparatus and an example of applying a reflection type electro-optic apparatus is not illustrated.

Figure 17A:
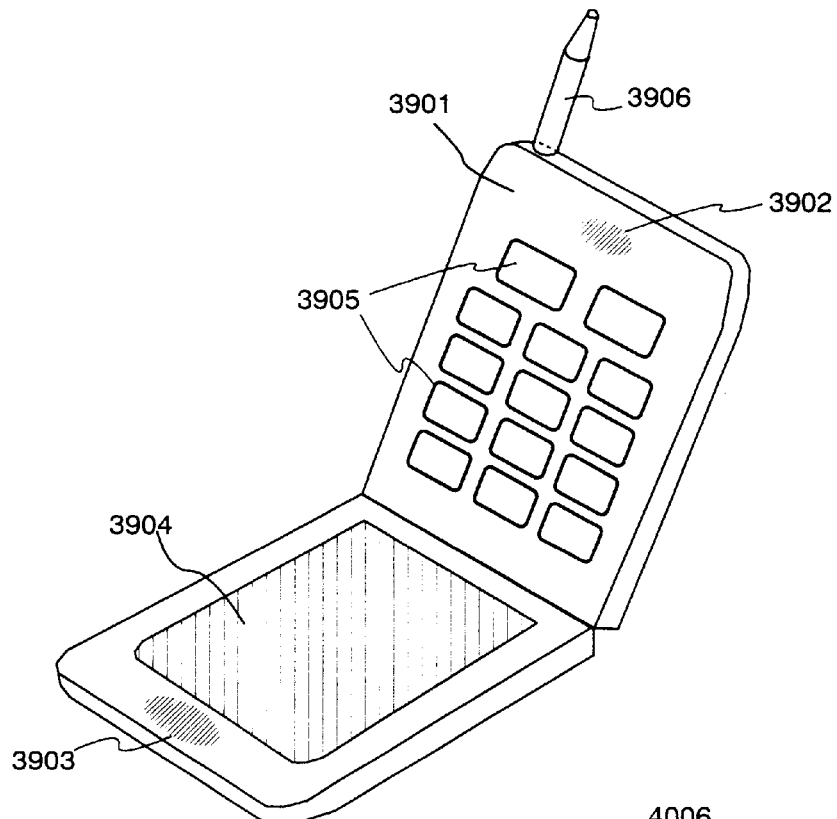
FIGS. 17A to 17C are diagrams showing examples of semiconductor devices.

FIG. 17A shows a portable telephone including a main body 3901, a voice output portion 3902, a voice input portion 3903, a display portion 3904, an operation switch 3905 and an antenna 3906. The invention is applicable to the voice output portion 3902, the voice input portion 3903, the display portion 3904 and other signal control circuits.

Figure 17B:
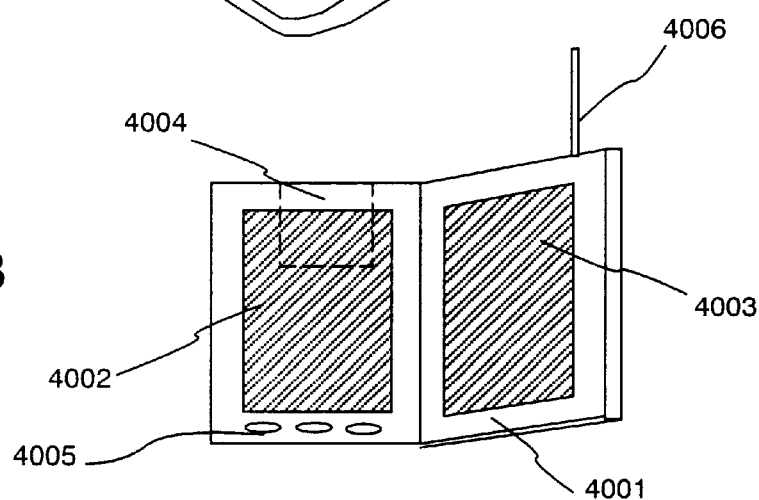

FIG. 17B shows a portable book (electronic book) including a main body 4001, display portions 4002 and 4003, a record medium 4004, an operation switch 4005 and an antenna 4006. The invention is applicable to the display portions 4002, 4003 and other signal control circuits.

Figure 17C:
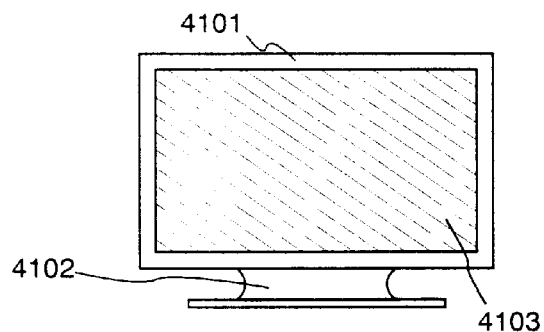

FIG. 17C shows a display including a main body 4101, a support base 4102 and a display portion 4103. The invention is applicable to the display portion 4103. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields. Further, the electronic apparatus of the embodiment can be realized by using any constitution comprising any combinations of embodiments 1 through 5.

The fundamental merits shown below can be obtained by employing the structure of the present invention:

a) A simple structure conforming to conventional TFT manufacturing processes;
b) Special precision positional determining techniques on a micron order are not required in order to determine the position of slits and the like, and therefore conventional laser irradiation apparatuses can be utilized as is;
c) An insulating layer used for its antireflection effect and its thermal insulating effect can also be utilized, as is, as a gate insulating film; and
d) By satisfying the above advantages, the present invention is a method capable of manufacturing a position controlled single crystal.

What is claimed is:

1. A method of manufacturing a semiconductor device, comprising the steps of:
   forming a base insulating film on a substrate;
   forming a first semiconductor film on said base insulating film;
   forming a first insulating film on said first semiconductor film;
   partially etching said first insulating film into a first insulating layer having a polygonal shape, wherein an angle of at least one vertex of said polygonal shape is less than 60°;
   forming a second semiconductor film covering said first insulating layer;
   forming a second insulating film covering said second semiconductor film;
   etching a portion of said second insulating film overlapping with said first insulating layer;
   irradiating a laser beam from a top surface side of said substrate, or from both of said top surface side and a bottom surface side of said substrate to obtain a crystalline semiconductor film from said first semiconductor film and said second semiconductor film; and
   forming a thin film transistor by using said crystalline semiconductor film in contact with said second insulating layer as a channel forming region.

2. The method according to claim 1, wherein said laser is one selected from the group consisting of an excimer laser, a YAG laser, a $YVO_4$ laser, a $YAlO_3$ laser, and a YLF laser.

3. The method according to claim 1, wherein said semiconductor device is a liquid crystal display device or an electro-luminescence display device.

4. The method according to claim 1, wherein said semiconductor device is one selected from the group consisting of a portable telephone, a video camera, a digital camera, a projector, a goggle-type display, a personal computer, a DVD player, an electronic book, and a portable information terminal.

5. A method of manufacturing a semiconductor device, comprising the steps of:
   forming a base insulating film on a substrate;
   forming a first semiconductor film on said base insulating film;
   forming a first insulating film on said first semiconductor film;
   partially etching said first insulating film into a first insulating layer having a polygonal shape, wherein an angle of at least one vertex of said polygonal shape is less than 60°;
   forming a second semiconductor film covering said first insulating layer;
   forming a second insulating film covering said second semiconductor film;
   partially etching said second insulating film to form a side surface aligned with said vertex through said second semiconductor film;
   irradiating a laser beam from a top surface side of said substrate, or from both of said top surface side and a bottom surface side of said substrate, to obtain a crystalline semiconductor film from said first semiconductor film and said second semiconductor film; and
   forming a thin film transistor by using said crystalline semiconductor film in contact with said second insulating layer as a channel forming region.

6. The method according to claim 5, wherein said laser is one selected from the group consisting of an excimer laser, a YAG laser, a $YVO_4$ laser, a $YAlO_3$ laser, and a YLF laser.

7. The method according to claim 5, wherein said semiconductor device is a liquid crystal display device or an electro-luminescence display device.

8. The method according to claim 5, wherein said semiconductor device is one selected from the group consisting of a portable telephone, a video camera, a digital camera, a projector, a goggle-type display, a personal computer, a DVD player, an electronic book, and a portable information terminal.

9. A method of manufacturing a semiconductor device, comprising the steps of:
   forming a base insulating film on a substrate;
   forming a first semiconductor film on said base insulating film;
   forming a first insulating film on said semiconductor film;
   partially etching said first insulating film into a first insulating layer having a polygonal shape, wherein an angle of at least one vertex of said polygonal shape is less than 60°;

forming a second semiconductor film covering said first insulating layer;

forming a second insulating film covering said second semiconductor film;

etching a portion of said second insulating film overlapping with said first insulating layer;

irradiating a laser beam from a top surface side of said substrate, or from both of said top surface side and a bottom surface side of said substrate to obtain a crystalline semiconductor film from said first semiconductor film and said second semiconductor film; and forming a thin film transistor by using said crystalline semiconductor film in contact with said second insulating layer as an active region.

10. The method according to claim 9, wherein said laser is one selected from the group consisting of an excimer laser, a YAG laser, a $YVO_4$ laser, a $YAlO_3$ laser, and a YLF laser.

11. The method according to claim 9, wherein said semiconductor device is a liquid crystal display device or an electro-luminescence display device.

12. The method according to claim 9, wherein said semiconductor device is one selected from the group consisting of a portable telephone, a video camera, a digital camera, a projector, a goggle-type display, a personal computer, a DVD player, an electronic book, and a portable information terminal.

13. A method of manufacturing a semiconductor device, comprising the steps of:

forming a base insulating film on a substrate;

forming a first semiconductor film on said base insulating film;

forming a first insulating film on said first semiconductor film;

partially etching said first insulating film into a first insulating layer having a polygonal shape, wherein an angle of at least one vertex of said polygonal shape is less than 60°;

forming a second semiconductor film covering said first insulating layer;

forming a second insulating film covering said second semiconductor film;

partially etching said second insulating film to form a side surface aligned with said vertex through said second semiconductor film;

irradiating a laser beam from a top surface side of said substrate, or from both of said top surface side and a bottom surface side of said substrate, to obtain a crystalline semiconductor film from said first semiconductor film and said second semiconductor film; and forming a thin film transistor by using said crystalline semiconductor film in contact with said second insulating layer as an active region.

14. The method according to claim 13, wherein said laser is one selected from the group consisting of an excimer laser, a YAG laser, a $YVO_4$ laser, a $YAlO_3$ laser, and a YLF laser.

15. The method according to claim 13, wherein said semiconductor device is a liquid crystal display device or an electro-luminescence display device.

16. The method according to claim 13, wherein said semiconductor device is one selected from the group consisting of a portable telephone, a video camera, a digital camera, a projector, a goggle-type display, a personal computer, a DVD player, an electronic book, and a portable information terminal.

17. A method of manufacturing a semiconductor device, comprising the steps of:

forming a base insulating film on a substrate;

forming a first semiconductor film on said base insulating film;

forming a first insulating film on said first semiconductor film;

partially etching said first insulating film into a first insulating layer having a polygonal shape, wherein an angle of at least one vertex of said polygonal shape is less than 60°;

forming a second semiconductor film covering said first insulating layer;

disposing a solution containing a catalyst element on said second semiconductor film;

crystallizing said first and said second semiconductor films by a heat treatment;

forming a second insulating film covering said crystallized semiconductor film;

etching a portion of said second insulating film overlapping with said first insulating layer;

irradiating said crystallized semiconductor film with a laser beam from a top surface side of said substrate, or from both of said top surface side and a bottom surface side of said substrate; and forming a thin film transistor by using said crystallized semiconductor film in contact with said second insulating layer as a channel forming region.

18. The method according to claim 17, wherein said laser is one selected from the group consisting of an excimer laser, a YAG laser, a $YVO_4$ laser, a $YAlO_3$ laser, and a YLF laser.

19. The method according to claim 17, wherein said semiconductor device is a liquid crystal display device or an electro-luminescence display device.

20. The method according to claim 17, wherein said semiconductor device is one selected from the group consisting of a portable telephone, a video camera, a digital camera, a projector, a goggle-type display, a personal computer, a DVD player, an electronic book, and a portable information terminal.

21. The method according to claim 17, wherein said catalyst element is one selected from the group consisting of nickel, palladium, and lead.

22. A method of manufacturing a semiconductor device, comprising the steps of:

forming a base insulating film on a substrate;

forming a first semiconductor film on said base insulating film;

forming a first insulating film on said first semiconductor film;

partially etching said first insulating film into a first insulating layer having a polygonal shape, wherein an angle of at least one vertex of said polygonal shape is less than 60°;

forming a second semiconductor film covering said first insulating layer;

disposing a solution containing a catalyst element on said second semiconductor film;

crystallizing said first and said second semiconductor films by a heat treatment;

forming a second insulating film covering said crystallized semiconductor film;

partially etching said second insulating film to form a side surface aligned with said vertex through said second semiconductor film;

irradiating said crystallized semiconductor film with a laser beam from a top surface side of said substrate, or from both of said top surface side and a bottom surface side of said substrate; and forming a thin film transistor by using said crystallized semiconductor film in contact with said second insulating layer as a channel forming region.

23. The method according to claim 22, wherein said laser is one selected from the group consisting of an excimer laser, a YAG laser, a YVO4 laser, a YAlO3 laser, and a YLF laser.

24. The method according to claim 22, wherein said semiconductor device is a liquid crystal display device or an electro-luminescence display device.

25. The method according to claim 22, wherein said semiconductor device is one selected from the group consisting of a portable telephone, a video camera, a digital camera, a projector, a goggle-type display, a personal computer, a DVD player, an electronic book, and a portable information terminal.

26. The method according to claim 22, wherein said catalyst element is one selected from the group consisting of nickel, palladium, and lead.

27. A method of manufacturing a semiconductor device, comprising the steps of:

forming a base insulating film on a substrate;

forming a first semiconductor film on said base insulating film;

forming a first insulating film on said first semiconductor film;

partially etching said first insulating film into a first insulating layer having a polygonal shape, wherein an angle of at least one vertex of said polygonal shape is less than 60°;

forming a second semiconductor film covering said first insulating layer;

disposing a solution containing a catalyst element on second semiconductor film;

crystallizing said first and said second semiconductor films by a heat treatment;

forming a second insulating film covering said crystallized semiconductor film;

etching a portion of said second insulating film overlapping with said first insulating layer;

irradiating said crystallized semiconductor film with a laser beam from a top surface side of said substrate, or from both of said top surface side and a bottom surface side of said substrate; and forming a thin film transistor by using said crystallized semiconductor film in contact with said second insulating layer as a an active region.

28. The method according to claim 27, wherein said laser is one selected from the group consisting of an excimer laser, a YAG laser, a YVO4 laser, a YAlO3 laser, and a YLF laser.

29. The method according to claim 27, wherein said semiconductor device is a liquid crystal display device or an electro-luminescence display device.

30. The method according to claim 27, wherein said semiconductor device is one selected from the group consisting of a portable telephone, a video camera, a digital camera, a projector, a goggle-type display, a personal computer, a DVD player, an electronic book, and a portable information terminal.

31. The method according to claim 27, wherein said catalyst element is one selected from the group consisting of nickel, palladium, and lead.

32. A method of manufacturing a semiconductor device, comprising the steps of:

forming a base insulating film on a substrate;

forming a first semiconductor film on said base insulating film;

forming a first insulating film on said first semiconductor film;

partially etching said first insulating film into a first insulating layer having a polygonal shape, wherein an angle of at least one vertex of said polygonal shape is less than 60°;

forming a second semiconductor film covering said first insulating layer;

disposing a solution containing a catalyst element on said second semiconductor film;

crystallizing said first and said second semiconductor films by a heat treatment;

forming a second insulating film covering said crystallized semiconductor film;

partially etching said second insulating film to form a side surface aligned with said vertex through said second semiconductor film;

irradiating said crystallized semiconductor film with a laser beam from a top surface side of said substrate, or from both of said top surface side and a bottom surface side of said substrate; and forming a thin film transistor by using said crystallized semiconductor film in contact with said second insulating layer as an active region.

33. The method according to claim 32, wherein said laser is one selected from the group consisting of an excimer laser, a YAG laser, a YVO4 laser, a YAlO3 laser, and a YLF laser.

34. The method according to claim 32, wherein said semiconductor device is a liquid crystal display device or an electro-luminescence display device.

35. The method according to claim 32, wherein said semiconductor device is one selected from the group consisting of a portable telephone, a video camera, a digital camera, a projector, a goggle-type display, a personal computer, a DVD player, an electronic book, and a portable information terminal.

36. The method according to claim 32, wherein said catalyst element is one selected from the group consisting of nickel, palladium, and lead.

* * * * *